United States Patent
Yamazaki et al.

(10) Patent No.: US 6,693,044 B1
(45) Date of Patent: Feb. 17, 2004

(54) SEMICONDUCTOR DEVICE AND METHOD OF MANUFACTURING THE SAME

(75) Inventors: Shunpei Yamazaki, Tokyo (JP); Masahiko Hayakawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/227,577

(22) Filed: Jan. 8, 1999

(30) Foreign Application Priority Data

Jan. 12, 1998 (JP) .......................................... 10-018098

(51) Int. Cl.[7] .............................................. H01L 21/302
(52) U.S. Cl. ..................... 438/745; 438/750; 438/751; 438/754; 257/40; 257/66
(58) Field of Search .................. 257/66, 347, 607, 257/4.04; 438/745, 753, 750, 751, 754

(56) References Cited

U.S. PATENT DOCUMENTS

| | | |
|---|---|---|
| 4,719,501 A | 1/1988 | Nakagawa et al. |
| 4,871,920 A | 10/1989 | Stabile et al. |
| 5,087,954 A | 2/1992 | Shirai |
| 5,147,826 A | 9/1992 | Liu et al. |
| 5,275,851 A | 1/1994 | Fonash et al. |
| 5,401,982 A | 3/1995 | King et al. |
| 5,403,772 A | 4/1995 | Zhang et al. |
| 5,508,533 A | 4/1996 | Takemura |
| 5,563,426 A | 10/1996 | Zhang et al. |
| 5,569,936 A | 10/1996 | Zhang et al. |
| 5,578,520 A | 11/1996 | Zhang et al. |
| 5,639,698 A | 6/1997 | Yamazaki et al. |
| 5,643,826 A | 7/1997 | Ohtani et al. |
| 5,648,277 A * | 7/1997 | Zhang et al. .................. 437/21 |
| 5,753,541 A | 5/1998 | Shimizu |
| 5,773,847 A * | 6/1998 | Hayakawa .................... 257/66 |
| 5,837,569 A * | 11/1998 | Makita et al. ............... 438/166 |

(List continued on next page.)

FOREIGN PATENT DOCUMENTS

| | | |
|---|---|---|
| JP | 2-222546 | 9/1990 |
| JP | 7-130652 | 5/1995 |
| JP | 7-135318 | 5/1995 |
| JP | 07-231100 | 8/1995 |
| JP | 8-78329 | 3/1996 |
| JP | 9-321305 | 12/1997 |
| JP | 10-135468 | 5/1998 |
| JP | 10-247735 | 9/1998 |
| JP | 11-204435 | 7/1999 |
| JP | 2000-114172 | 4/2000 |

OTHER PUBLICATIONS

R. Ishihara et al., "Microtexture Analysis of Location Controlled Large Si Grain Formed by Excimer–Laser Crystallization Method," AM–LCD '99, pp. 99–102.

"Crystallized Si Films By Low–Temperature Rapid Thermal Annealing of Amorphous Silicon," R. Kakkad, et al., J. Appl. Phy. 65, No. 5, Mar. 1, 1989, 1989 American Institute of Physics, pp. 2069–2072.

(List continued on next page.)

Primary Examiner—Nadine G. Norton
Assistant Examiner—Lan Vinh
(74) Attorney, Agent, or Firm—Eric J. Robinson; Robinson Intellectual Property Law Office, P.C.

(57) ABSTRACT

A semiconductor device, which uses a crystalline silicon film having high crystallinity and a flat surface with few ridges and has high characteristics, and a method of manufacturing the semiconductor device are provided. According to the manufacturing method, a first amorphous silicon film is crystallized by using a heat treatment. A second amorphous silicon film is formed on a first crystalline silicon film thus obtained as an under film, and the second amorphous silicon film is crystallized by irradiation of laser light, so that a silicon film having excellent crystallinity and a surface with few ridges is obtained. The first crystalline silicon film and the second crystalline silicon film having different crystal structures are used as an active layer of a thin film transistor.

31 Claims, 12 Drawing Sheets

U.S. PATENT DOCUMENTS

| | | | |
|---|---|---|---|
| 5,904,770 A | * | 5/1999 | Ohtani et al. ............... 117/103 |
| 5,923,962 A | | 7/1999 | Ohtani et al. |
| 5,923,966 A | | 7/1999 | Teramoto et al. |
| 5,998,804 A | * | 12/1999 | Suh et al. .................... 257/40 |
| 6,048,780 A | | 4/2000 | Hayakawa |
| 6,066,547 A | | 5/2000 | Maekawa |
| 6,140,165 A | | 10/2000 | Zhang et al. |
| 6,165,824 A | | 12/2000 | Takano et al. |
| 6,218,678 B1 | | 4/2001 | Zhang et al. |
| 6,232,156 B1 | | 5/2001 | Ohtani et al. |
| 6,285,042 B1 | | 9/2001 | Ohtani et al. |
| 6,388,270 B1 | | 5/2002 | Yamazaki et al. |
| 6,482,684 B1 | | 11/2002 | Yamazaki |
| 2002/0013114 A1 | | 1/2002 | Ohtani et al. |
| 2002/0043660 A1 | | 4/2002 | Yamazaki et al. |
| 2003/0010980 A1 | | 1/2003 | Yamazaki et al. |

OTHER PUBLICATIONS

"Polycrystalline Silicon Thin Film Transistors on Corning 7059 Glass Substrates Using Short Time, Low–Temperature Processing," Gang Liu et al., Appl. Phys. Lett.. Vol. 62, No. 20, May 17, 1993, 1993 American Institute of Physics, pp. 2554–2556.

"Selective Area Crystallization of Amorphous Silicon Films by Low–Temperature Rapid Thermal Annealing," Gang Liu et al., Appl. Phys. Lett. 55, No. 7, Aug. 14, 1989, 1989 American Institute of Physics, pp. 660–662.

"Low Temperature Selective Crystallization of Amorphous Silicon," R. Kaddad et al., Journal of Non–Crystalline Solids 115, 1989, pp. 66–68.

C. Hayzelden et al., "In Situ Transmission Electron Microscopy Studies of Silicide–Mediated Crystallization of Amorphous Silicon" (3 pages) Received Aug. 2, 1991; accepted for Publication Oct. 29, 1991.

A.V. Dvurechenskii et al., "Transport Phenomena in Amorphous Silicon Doped by Ion Implantation of 3d Metals," Akademikian Lavrentev Prospekt 13, 630090 Novosibirsk 90, USSR, pp. 635–640.

T. Hempel et al., "Needle–Like Crystallization of Ni Doped Amorphous Silicon Thin Films," Solid State Communications, vol. 85, No. 11, pp. 921–924, 1993.

Mishima, "Flat–Panel Display", p. 218–221, 1998 including concise statement thereof.

* cited by examiner

CMOS CIRCUIT | PIXEL MATRIX CIRCUIT

CMOS CIRCUIT | PIXEL MATRIX CIRCUIT

SEMICONDUCTOR DEVICE AND METHOD OF MANUFACTURING THE SAME

BACKGROUND OF THE INVENTION

1. Field of the Invention

The present invention relates to a method of manufacturing a semiconductor thin formed on a substrate having an insulating surface and a semiconductor device using the semiconductor thin film as an active layer. Particularly, the present invention relates to a semiconductor thin film in which an amorphous semiconductor thin film containing silicon as its main ingredient is crystallized to obtain a thin film.

Moreover, the present invention relates to the structure of a semiconductor circuit and an electro-optical device, which are constituted by a semiconductor device such as a thin film transistor, and to the structure of an electronic apparatus incorporating those.

Incidentally, in the present specification, all of the thin film transistor, semiconductor circuit, electro-optical device, and electronic apparatus are contained in the category of "semiconductor device". That is, any device capable of functioning by using semiconductor properties is called a semiconductor device. Thus, the term "semiconductor device" included in the present invention includes not only a single element such as a thin film transistor but also a semiconductor circuit obtained by integrating the single elements, an electro-optical device, and an electronic apparatus incorporating those as parts.

2. Description of the Related Art

In recent years, attention has been paid to a technique for constituting a thin film transistor (TFT) by using a semiconductor thin film (its thickness is several tens to several hundreds nm) formed on a substrate having an insulating surface. Particularly, development of the thin film transistor as a switching element of an image display device (for example, a liquid crystal display device) has been hastened.

For example, in a liquid crystal display device, trials have been made to apply TFTs to any electric circuit, such as a pixel matrix circuit for controlling each of pixel regions arranged in matrix, a driving circuit for controlling the pixel matrix circuit, and a logic circuit (arithmetic circuit, memory circuit, clock generator, etc.) for processing data signals from the outside.

In the present circumstances, although a TFT using a noncrystalline silicon film (amorphous silicon film ) as an active layer is put to practical use, a TFT using a crystalline silicon film (polysilicon film, etc.) is necessary for an electric circuit, such as a driving circuit or a logic circuit, required to have higher speed operation performance.

Conventionally, a crystalline silicon film is obtained in such a manner that heat treatment, irradiation of laser light, or irradiation of intense light is carried out after an amorphous silicon film is formed on a substrate having an insulating surface or an under film having an insulating surface by a plasma CVD method or a low pressure CVD method.

Among the above conventional methods of obtaining a crystalline silicon film, the quality of a film obtained by the method of irradiation of laser light is excellent as compared with other methods, and the method has a high throughput and has a merit that thermal damage is not caused to a substrate, so that the method is often used.

However, according to the method of irradiation of laser light, if the thickness of an amorphous silicon film is 100 nm or less, many ridges (asperities) are formed on the surface of the obtained crystalline silicon film so that the film quality is degraded. That is, when a silicon film is irradiated with laser light, the silicon film is instantaneously melted and is locally expanded, and ridges (asperities) are formed on the surface of the obtained crystalline silicon film to relieve the inner stress generated by this expansion. The difference in the height of the ridge is about ½ to 1 time the thickness of the film.

In an insulated gate semiconductor device, since a potential barrier or a trap level caused by a dangling bond, distortion of a lattice, or the like are formed in the ridge on the surface of the crystalline silicon film, an interfacial level between an active layer and a gate insulating film is raised. Further, since the top portion of the ridge is steep, an electric field is apt to be concentrated, so that the ridge becomes a generating source of leak current, and finally, breakdown occurs and a short circuit is brought about. In addition, the ridge on the surface of the crystalline silicon film damages the covering properties of the gate insulating film deposited by a sputtering method or a CVD method, and causes poor insulation or the like to degrade the reliability. Thus, the ridge on the surface of the crystalline silicon film influences all the characteristics of a TFT and even a yield is changed.

Moreover, the method of irradiation of laser light is apt to become unstable particularly under a condition to obtain excellent crystallinity, and if the energy density of laser light is increased to make sufficient crystallization, there is a tendency that ridges are increased and the surface of a film becomes rough.

SUMMARY OF THE INVENTION

An object of the present invention is to solve the above problems and to provide a semiconductor device which has high characteristics and uses a crystalline silicon film having high crystallinity and having a flat surface with few ridges (asperities), and a method of manufacturing the same.

According to a first aspect of the present invention, a method of manufacturing a semiconductor device is characterized by comprising the steps of: forming a first amorphous silicon film on an insulating surface; obtaining a first crystalline silicon film by carrying out a heat treatment to crystallize the first amorphous silicon film; forming a second amorphous silicon film on the first crystalline silicon film; and obtaining a second crystalline silicon film by applying an energy to crystallize the second amorphous silicon film.

According to a second aspect of the present invention, a method of manufacturing a semiconductor device is characterized by comprising the steps of: forming a first amorphous silicon film on an insulating surface; obtaining a first crystalline silicon film by carrying out a heat treatment to crystallize the first amorphous silicon film; etching a surface of the first crystalline silicon film; forming a second amorphous silicon film on the first crystalline silicon film; and obtaining a second crystalline silicon film by applying an energy to crystallize the second amorphous silicon film.

In the second aspect of the present invention, an etchant containing hydrofluoric acid is used as an etchant in the etching step.

According to a third aspect of the present invention, a method of manufacturing a semiconductor device is characterized by comprising the steps of: forming a first amorphous silicon film on an insulating surface; introducing a metal element for facilitating crystallization of silicon into the first amorphous silicon film; obtaining a first crystalline silicon film by carrying out a heat treatment to crystallize the first amorphous silicon film; forming a second amorphous silicon film on the first crystalline silicon film; and obtaining a second crystalline silicon film by applying an energy to crystallize the second amorphous silicon film.

In the third aspect of the present invention, it is characterized in that one kind of or plural kinds of elements selected from Fe, Co, Ni, Ru, Rh, Pd, Os, Ir, Pt, Cu, Ag, and Au are used as a metal element for facilitating crystallization of silicon.

Moreover, in the third aspect of the present invention, it is preferable to use nickel as the metal element for facilitating crystallization of silicon.

Moreover, in each of the above aspects of the present invention, crystallization of the second amorphous silicon film is carried out by using the surface of the first crystalline silicon film as nuclei of crystal growth.

Moreover, in each of the above aspects, it is characterized in that, as a method of applying the energy, a method of irradiation of laser light is used. Moreover, as a method of applying the energy, in addition to irradiation of laser light, it is preferable to use one kind of or plural kinds of methods selected from irradiation of intense light and heating concurrently or sequentially. Moreover, in each of the above aspects, it is preferable that the irradiation energy density of the laser light is 100 to 300 $mJ/cm^2$.

According to a fourth aspect of the present invention, in a semiconductor device comprising an active layer made of a semiconductor thin film formed on an insulating substrate, a gate insulating film, and a gate electrode, it is characterized in that the active layer includes a laminated structure made of a first crystalline silicon film and a second crystalline silicon film stacked on the first crystalline silicon film; the first crystalline silicon film includes a crystal structure obtained by crystallization through heating; and the second crystalline silicon film has a crystal structure obtained by crystallization through irradiation of laser light.

In the above fourth aspect of the present invention, it is characterized in that the crystal structure obtained by crystallization through heating includes thin rod-like crystals or flattened rod-like crystals.

Moreover, in the fourth aspect of the present invention, it is characterized in that the crystal structure obtained by crystallization through heating is such that thin rod-like crystals or flattened rod-like crystals are grown with intervals and in parallel to or substantially in parallel to each other.

In the present invention, although any well-known means may be used to crystallize the first amorphous silicon film to form the first crystalline silicon film, crystallization through heat treatment is preferable. The thus obtained first crystalline silicon film is used as an under film, the second amorphous silicon film is formed thereon, and the second crystalline silicon film is formed by irradiation of laser light, so that excellent flatness can be obtained. Moreover, at the irradiation of the laser light, an irradiated region may be heated at a temperature ranging from 450° C. to the distortion point of the substrate to make a step of obtaining further excellent crystallinity.

The present invention is characterized in that the second crystalline silicon film is obtained by irradiation of laser light while using the surface of the first crystalline silicon film as nuclei of crystal growth. Thus, the second crystalline silicon film is influenced by the surface of the first crystalline silicon film. That is, if the surface of the first crystalline silicon film is excellent as nuclei, the second crystalline silicon film having excellent crystallinity and flatness can be obtained. Accordingly, it is preferable to form an excellent surface by etching the surface of the first crystalline silicon film when the second amorphous silicon film is formed. Alternatively, it is preferable to form the second amorphous silicon film while an excellent surface of the first amorphous silicon film immediately after crystallization is maintained. When the thus obtained two-layer crystalline silicon film is used for an active layer of a thin film transistor, a semiconductor device having superior characteristics can be obtained.

As compared with a conventional crystalline silicon film in which an amorphous silicon film formed on an insulating film of $SiO_2$ or the like is crystallized by irradiation of laser light, in the present invention, it is possible to obtain an excellent crystalline silicon film having a flat surface with fewer ridges.

Although the film qualities of the first amorphous silicon film and the second amorphous silicon film are almost the same, the first crystalline silicon film and the second crystalline silicon film are different from each other in crystal grain boundaries, that is, in the crystal structure, which is one of the features of the present invention.

This can be confirmed by secoetching (as an etchant, a mixture solution of HF=50 cc, $K_2Cr_2O_7$=1.14 g, and $H_2O$= 25 cc). When this secoetching is carried out, it is possible to observe defects and crystal grain boundaries on the surface by SEM observation or the like.

That is, the surface structure of the first crystalline silicon film crystallized by a heat treatment has an irregular crystal structure as shown in FIG. 14A in which an example is shown, and the respective crystals do not have regularity. FIG. 14A is a SEM observation photograph of a surface of a crystalline silicon film which was obtained by only a heat treatment (600° C., 24 hours) and was subjected to secoetching.

Moreover, in the case where the first crystalline silicon film is crystallized by addition of a catalytic element and by a heat treatment (using the technical content of Embodiment 1 of Japanese Patent Laid-open No. Hei. 7-130652 having U.S. Pat. No. 5,643,826 corresponding thereto, which are herein incorporated by reference), although not shown, crystals grow radially from a limitless number of point centers in the whole surface of the film, and the respective radial crystals grow like rods in which crystal lattices are continuous.

Moreover, in the case where the first crystalline silicon film is crystallized by addition of a catalytic element and by a heat treatment (using the technical content of Embodiment 2 of Japanese Patent Laid-open No. Hei. 7-130652), although not shown, the structure of crystal lattices is continuous in almost a specific direction, and thin rod-like crystals or thin flattened rod-like crystals are grown.

As compared with these foregoing first crystalline silicon films, the crystal structure of the surface of the second crystalline silicon film is quite different. FIG. 14B is a SEM observation photograph of a surface of a conventional crystalline silicon film which was obtained by irradiation of laser light (340 $mJ/cm^2$) and was subjected to secoetching. As shown in FIG. 14B in which one example of the patterns is shown, the film has regular (like tortoiseshell pattern) crystal grain boundaries.

The second crystalline silicon film of the present invention is characterized in that it has fewer ridges than the prior art (FIG. 14B) and has excellent flatness.

In the present specification, the crystal structure obtained by crystallization through heating indicates a structure one example of which is shown in the pattern of FIG. 14A. That is, each of the crystals in the crystal structure is constituted by irregular crystal grains, thin rod-like crystal grains, or thin flattened rod-like crystal grains.

Moreover, in the present specification, the crystal structure obtained by crystallization through irradiation of laser light indicates a structure one example of which is shown in the pattern of FIG. 14B. That is, the crystal structure is constituted by regular (like tortoiseshell pattern) crystal grains.

DETAILED DESCRIPTION OF THE PREFERRED EMBODIMENTS

Figure 1A:
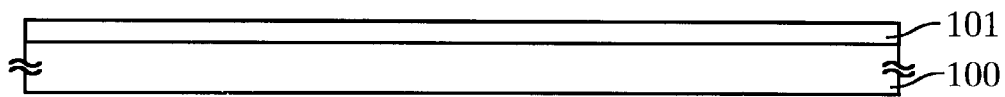
FIGS. 1A to 1E are views showing manufacturing steps of Embodiment 1.

Preferred embodiments of the present invention will be described below with reference to the drawings. However, it is needless to say that the present invention is not limited to these embodiments.

Embodiment 1

In this embodiment, steps of manufacturing a second crystalline silicon film on a first crystalline silicon film obtained by a heat treatment will be described with reference to FIGS. 1A to 1E.

First, a substrate 100 (in this embodiment, a quartz substrate) having high heat resistance is prepared, and an insulating silicon film (not shown) with a thickness of 300 nm is formed as an under film on the substrate. The insulating silicon film is a silicon oxide film (SiOx), a silicon nitride film (SixNy), a silicon nitride oxide film (SiOxNy), or a laminated film thereof. However, if the surface of the substrate has sufficient flatness and insulation properties, such a structure may be adopted that the under film is not formed.

If the distortion point is 750° C. or more, a glass substrate (typically, a material called crystallized glass, glass ceramics, or the like) can also be used. In that case, if an under film is provided by a low pressure CVD method to cover the entire surface of the substrate with an insulating silicon film, such an effect is obtained that the outflow of constituent materials from the glass substrate can be suppressed. Moreover, it is possible to adopt such means that the entire surface of the substrate is covered with an amorphous silicon film and the film is completely transformed into a thermal oxidation film.

Next, a first amorphous silicon film 101 is formed on the under film or the substrate in accordance with the following condition. The first amorphous silicon film 101 with a thickness of 10 nm to 100 nm (typically 30 to 60 nm) by a plasma CVD method or an LPCVD method, in this embodiment, the first amorphous silicon film 101 with a thickness of 30 nm is formed by the LPCVD method in accordance with the following condition (FIG. 1A):

film formation temperature: 465° C., film formation pressure: 0.5 torr, film formation gas: He (helium) 300 sccm, and $Si_2H_6$ (disilane) 250 sccm.

Incidentally, it is important to thoroughly carry out management of impurity concentration in a film at the film formation. In the case of this embodiment, management is carried out so that the concentration of each of C (carbon) and N (nitrogen) which are impurities to hinder crystallization in the first amorphous silicon film 101 is less than $5 \times 10^{18}$ atoms/cm$^3$ (typically $5 \times 10^{17}$ atoms/cm$^3$ or less, preferably $2 \times 10^{17}$ atoms/cm$^3$ or less), and the concentration of O (oxygen) is less than $1.5 \times 10^{19}$ atoms/cm$^3$ (typically $1 \times 10^{18}$ atoms/cm$^3$ or less, preferably $5 \times 10^{17}$ atoms/cm$^3$ or less). This is because if the concentration of the respective impurities is not less than the above, they have a bad influence on subsequent crystallization, and cause the film quality after crystallization to be degraded.

In order to obtain the foregoing structure, it is desirable that a low pressure CVD furnace used in this embodiment is periodically subjected to dry cleaning to clean a film formation chamber. It is appropriate that the dry cleaning is carried out in such a manner that a $ClF_3$ (chlorine fluoride) gas of 100 to 300 sccm is flown into a furnace heated up to about 200 to 400° C. and cleaning of the film formation chamber is carried out by fluorine produced by pyrolysis.

According to the knowledge of the present inventors, in the case where the temperature in a furnace is 300° C. and the flow rate of a $ClF_3$ (chlorine fluoride) gas is 300 sccm, it is possible to completely remove a stuck substance (containing silicon as its main ingredient) with a thickness of about 2 µm in four hours.

The concentration of hydrogen in the first amorphous silicon film 101 is also a very important parameter, and it appears that a film having superior crystallinity can be obtained as a hydrogen content is made low. Thus, it is preferable that the amorphous silicon film 101 is formed by the low pressure CVD method. Incidentally, it is also possible to use the plasma CVD method if the film formation condition is optimized. Thereafter, it is preferable to carry out dehydrogenating at about 450° C. for one hour.

Figure 1B:
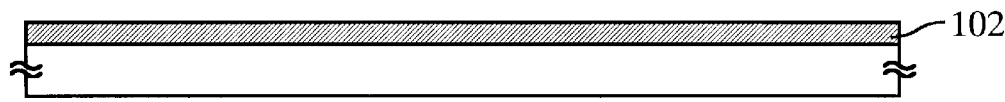
Figure 1C:

Next, crystallization of the first amorphous silicon film 101 is carried out by a heat treatment. This heat treatment is carried out in an inert gas atmosphere, a hydrogen atmosphere, or an oxygen atmosphere at a temperature of 500 to 1000° C. for 12 to 72 hours. Although the effect becomes great as the heating temperature becomes high, in view of heat resistance of the substrate, it is necessary that the temperature is made not higher than the distortion point of the substrate to be used. In the case where a substrate having heat resistance, such as a quartz substrate or a semiconductor substrate, is used, it is possible to carry out a heat treatment at about 800 to 1000° C. Thus, in this embodiment, a first crystalline silicon film 102 is obtained by a heat treatment in a nitrogen atmosphere at 600° C. for 24 hours, and further, by a subsequent heat treatment at 800° C. to 1000° C. for 1 to 5 hours (FIG. 1B). Moreover, if it is necessary to improve the crystallinity after this step, laser annealing may be carried out.

It is preferable to take such a structure that after the crystallization by the heat treatment is ended, etching is carried out by using an etchant containing hydrofluoric acid and a step of removing impurities on the surface (FIG. 1C) is added. It is necessary to wash the exposed surface of the first crystalline silicon film by a hydrofluoric acid based etchant (it is necessary to contain fluorine and hydrogen), for example, hydrofluoric acid, buffer hydrofluoric acid, or FPM (mixture solution of hydrofluoric acid, hydrogen peroxide, and water). This washing is carried out to remove (etch) an oxide film or other films containing carbon, nitrogen, etc. which are formed on the surface of the first crystalline silicon film. These films may hinder crystallization of a second amorphous silicon film in a subsequent step. In the case where the surface of the silicon film is washed by buffer hydrofluoric acid or FPM, hydrogen is absorbed on the surface, so that dangling bonds of silicon atoms on the surface can be neutralized. Then it is possible to prevent oxidation or formation of other compound films.

Figure 1D:
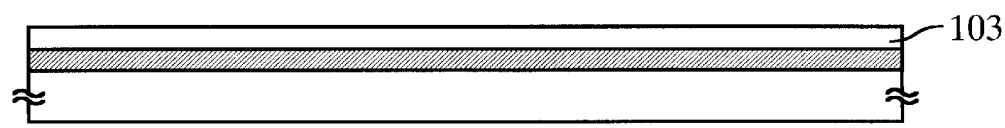

Next, a second amorphous silicon film 103 is formed on the first crystalline silicon film or the first crystalline silicon film in which the oxide on the surface is removed (FIG. 1D). It is preferable that the second amorphous silicon film is obtained under the same manufacturing condition as the first amorphous silicon film. The second amorphous silicon film with a thickness of 10 nm to 100 nm (typically 30 to 60 nm), in the embodiment, 30 nm is formed by the LPCVD method. The amorphous silicon film obtained by the LPCVD is preferable since its hydrogen content is lower than that obtained by the plasma CVD method, and excellent film qualities can be obtained. Incidentally, if the film forming condition is optimized, the plasma CVD method can also be used.

Figure 1E:

Next, the obtained second amorphous silicon film is crystallized by using laser light (FIG. 1E). It is preferable to use a pulse oscillation laser having a wavelength shorter than an ultraviolet region, such as a KrF excimer laser or XeCl excimer laser. In this embodiment, a XeCl excimer laser (wavelength 308 nm) is used. The energy density of a linear laser beam on an irradiated surface is 100 to 500 mJ/cm$^2$, preferably 100 to 300 mJ/cm$^2$, in this embodiment, 300 mJ/cm$^2$, and crystallization is made by irradiation. When the oscillation frequency of the laser is 30 Hz and attention is paid to one point of the irradiated material, ten shots of laser beams are applied. The number of shots is suitably selected in the range of 5 shots to 50 shots. At the irradiation of the laser, it is also possible to add a step of obtaining further excellent crystallinity by heating the irradiated region at a temperature ranging from 450° C. to the distortion point of the substrate.

By the laser irradiation process, the portion 102 becomes crystal nuclei and crystal growth is progressed. By the laser irradiation process, the second amorphous silicon film indicated by 103 is crystallized. The crystal growth of this film is carried out while the surface of the region regarded as single crystal or the first crystalline silicon film 102 regarded as substantially single crystal becomes nuclei, so that a region regarded as a single crystal or a second crystalline silicon film 104 regarded as substantially single crystal is formed.

At the same time as the crystallization of the second amorphous silicon film 103, the laser annealing process is applied to the first crystalline silicon film 102, so that the crystallinity of the first crystalline silicon film is improved.

Figure 14A:
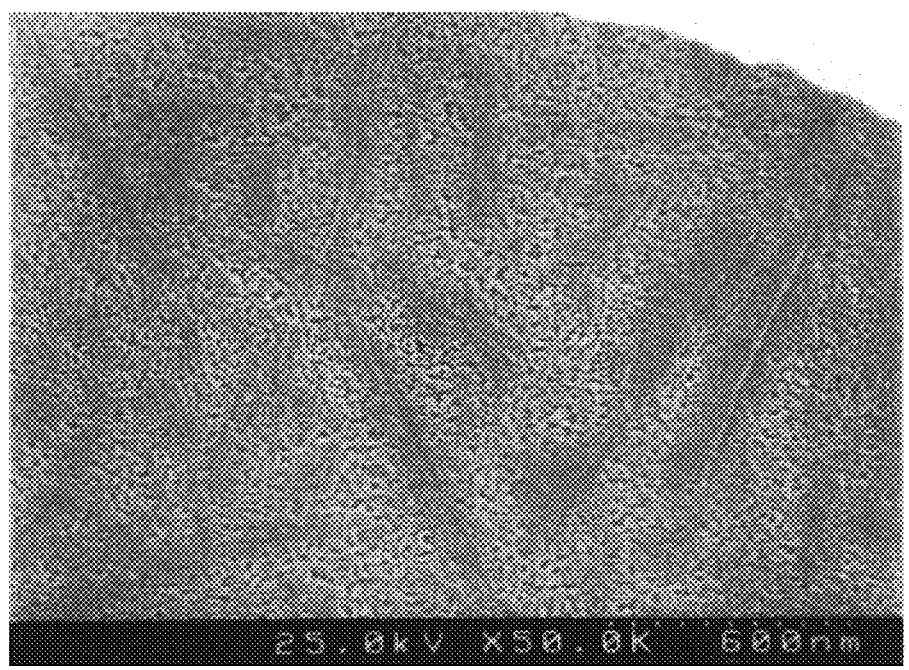
FIGS. 14A and 14B are views of surface structures by secoetching (SEM).

The crystal structure of the second crystalline silicon film 104 varies depending on the crystal structure of the surface of the first crystalline silicon film as the nuclei, the film forming condition and method of crystallization of the amorphous silicon film 103 as a starting film. Particularly, although the crystal grain in the first crystalline silicon film of this embodiment has a shape shown in FIG. 14A, the second crystalline silicon film has a crystal structure similar to the crystal structure shown in FIG. 14B. The crystal grains of the second crystalline silicon film are comparatively more uniform.

The second crystalline silicon film 104 obtained through the above steps has an excellent surface with few ridges.

Embodiment 2

In this embodiment, steps will be described with reference to FIGS. 2A to 2E, in which a catalytic element for facilitating crystallization is added, and a second crystalline silicon film is obtained on a first crystalline silicon film obtained by a heat treatment at a low temperature as compared with Embodiment 1.

As means for crystallization of the first crystalline silicon film, the technique disclosed in Japanese Patent Laid-open No. Hei. 7-130652 having U.S. Pat. No. 5,643,826 corresponding thereto, which are herein incorporated by reference, by the present inventors is used. Although the means of Embodiment 1 and Embodiment 2 of the publication may be used, an example in which the technical content set forth in Embodiment 1 of the publication is used will be described in this embodiment.

Figure 2A:
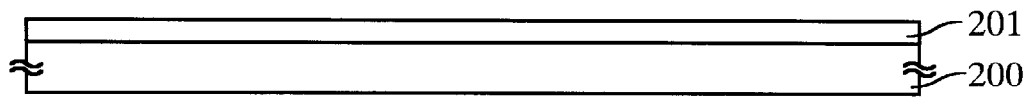
FIGS. 2A to 2E are views showing manufacturing steps of Embodiment 2.

First, a silicon oxide film (not shown) with a thickness of 100 to 500 nm, for example, 400 nm was formed as an under oxide film on a substrate 200 (Corning 1737) by a sputtering method. This silicon oxide film is provided to prevent impurities from diffusing from the glass substrate. Then, a first amorphous silicon film with a thickness of 30 to 100 nm was formed by a plasma CVD method or an LPCVD method. Here, a first amorphous silicon film 201 with a thickness of 30 nm was formed by the LPCVD method by which a film with a low hydrogen content was obtained (FIG. 2A).

Figure 2B:
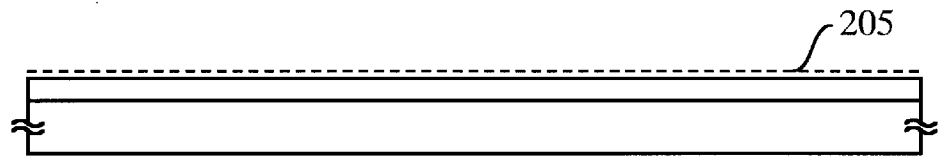

Then, a layer (nickel containing layer 205) containing nickel or a nickel compound and having a thickness of several to several tens Å is formed on the first amorphous silicon film 201. The nickel containing layer 205 may be formed by a method in which after a solution containing nickel is applied, drying is carried out (for example, spin coating method, dipping method), by a method in which a film of nickel or nickel compound is formed by a sputtering method, or by a method in which gaseous organic nickel is decomposed and deposited by heat, light, or plasma (vapor phase growth method). Here, the film was formed by the spin coating method (FIG. 2B).

In this embodiment, although nickel is used as a catalytic element for facilitating crystallization, the element is not particularly limited. A kind of or plural kinds of elements selected from Fe, Co, Ni, Ru, Rh, Pd, Os, Ir, Pt, Cu, Ag, and Au can be used as the catalytic element for facilitating crystallization.

Next, an oxide film with a thickness of 1 to 5 nm is formed on the first amorphous silicon film 201 by irradiation of UV light in an oxygen atmosphere, a thermal oxidation method, a treatment by hydrogen peroxide, or the like. Here, an oxide film with a thickness of 2 nm was formed by irradiation of UV light in an oxygen atmosphere. This oxide film is provided so that in a subsequent step of applying an acetate solution containing nickel, the acetate solution is applied all over the surface of the first amorphous silicon film, that is, wettability is improved.

Next, a nickel acetate solution in which nickel was added to an acetate solution was prepared. The concentration of nickel was 25 ppm. The acetate solution of 2 ml was dropped on the surface of a rotating substrate, and this state was maintained for 5 minutes so that this nickel acetate solution was uniformly applied over the substrate. Thereafter, the revolutions of the substrate were raised and spin drying (2000 rpm, 60 seconds) was carried out.

If the concentration of nickel in the acetate solution is 1 ppm or more, it is practical. Coating steps of the nickel solution was carried out once or plural times, so that a nickel acetate layer 205 with an average film thickness of 20 Å was formed on the surface of the first amorphous silicon film after the spin drying. Incidentally, this layer is not necessarily a complete film. Even if other nickel compounds are used, a similar layer can be formed.

Figure 2C:

Thereafter, a heat treatment in a nitrogen atmosphere at 550° C. for 4 hours was carried out in a heating furnace and crystallization was made. As a result, a first crystalline silicon film 202 was obtained on the substrate (FIG. 2C).

As a subsequent step, it is preferable to add a step of removing an oxide film on the first crystalline silicon film 202 by using buffer hydrofluoric acid so that the surface of the first crystalline silicon film 202 is made excellent crystal nuclei.

Figure 2D:
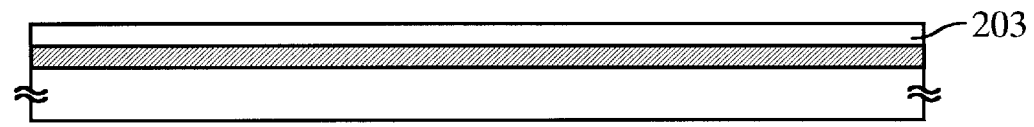

Then a second amorphous silicon film 203 with a thickness of 30 to 100 nm, for example, 30 nm was formed by a plasma CVD method on the first crystalline silicon film or the first crystalline silicon film in which the oxide film on the surface was removed (FIG. 2D). Although it is preferable to obtain the second amorphous silicon film 203 under the same manufacturing condition as the first amorphous silicon film, the condition is not necessarily limited, but different manufacturing steps may be adopted.

Thereafter, a crystallizing process by laser irradiation was carried out. It is preferable to use as the laser light a pulse oscillation laser having a wavelength not longer than an ultraviolet region. For example, it is preferable to use a KrF excimer laser or a XeCl excimer laser. The irradiation density of the laser light is 130 to 300 mJ/cm$^2$, preferably 180 to 230 mJ/cm$^2$. In this embodiment, the excimer laser of KrF (wavelength 248 nm, pulse width 20 nsec) is used and irradiation at 230 mJ/cm$^2$ is carried out to make crystallization.

At the irradiation of the laser light, a step of heating a sample (substrate) or an irradiated surface at a temperature ranging from 400° C. to the distortion point of the glass substrate, or at a temperature ranging from 400° C. to the crystallization temperature of the amorphous silicon film may be added. It is desirable that this temperature is made as high as possible. This heating is very effective in suppressing rapid phase change due to the irradiation of the laser light and preventing crystal grain boundaries or defects from being formed.

Figure 2E:
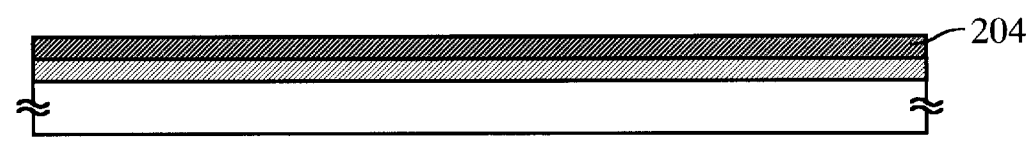

Through the above steps, an excellent second crystalline silicon film 204 having a film surface with few ridges was obtained on the first crystalline silicon film (FIG. 2E).

Figure 14B:
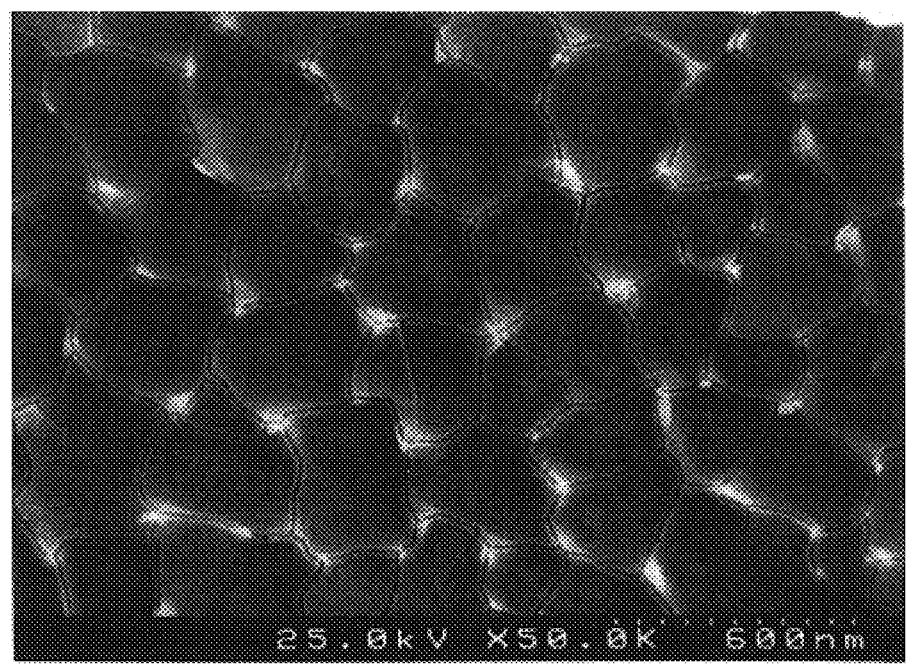

Here, although nickel added at the crystallization exists as impurities in the first crystalline silicon film 202, impurities (nickel etc.) are hardly contained in the second crystalline silicon film 204, and a semiconductor layer with excellent device characteristics can be obtained. The crystal growth of the second crystalline silicon film is carried out using the surface of the second crystalline silicon film of the under layer as the nuclei of crystal growth. Here, the first crystalline silicon film is longitudinally grown. Although the second crystalline silicon film is influenced from the surface of the first crystalline silicon film, since the crystallizing method is different, the crystal structure is different. Especially, in the first crystalline silicon film 202, crystals radially grow from a limitless number of point centers on the entire surface, and the respective radial crystals grow like rods where the crystal lattices are continuous. On the other hand, the second crystalline silicon film has a crystal structure similar to the crystal structure as shown in FIG. 14B (crystal grain boundaries of tortoiseshell patterns).

Embodiment 3

In this embodiment, as compared with Embodiment 2, a different method (technical content set forth in Embodiment 2 of Japanese Patent Laid-open No. Hei. 7-130652 having U.S. Pat. No. 5,643,826 corresponding thereto, which are herein incorporated by reference, by the present inventors (details are disclosed in Japanese Patent Laid-Open No. Hei. 8-78329, which is herein incorporated by reference)) of adding a catalytic element for facilitating crystallization is used, and steps of obtaining a second crystalline silicon film on a first crystalline silicon film obtained by a heat treatment will be described with reference to FIGS. 3A to 3F.

Figure 3A:
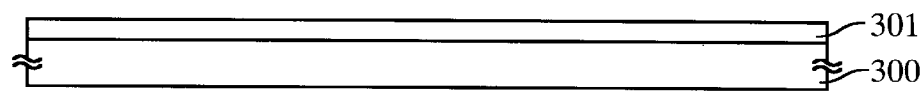
FIGS. 3A to 3F are views showing manufacturing steps of Embodiment 3.

First, a silicon oxide film with a thickness of 500 nm was formed as an under oxide film (not shown) on a substrate 300 through deposition and decomposition of TEOS by a plasma CVD method. Then a first amorphous silicon film 301 with a thickness of 30 nm was formed by an LPCVD method (FIG. 3A).

Figure 3B:
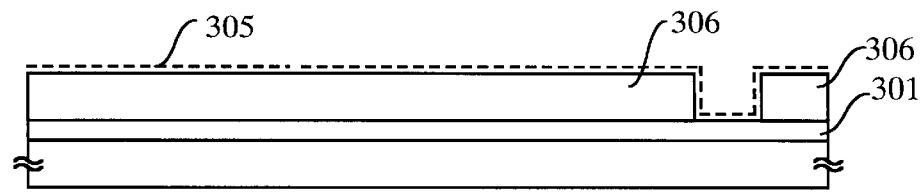

Next, a crystallizing step of the first amorphous silicon film 301 is carried out by using a technique set forth in Japanese Patent Laid-open No. Hei. 8-78329. According to the technique set forth in the publication, a mask insulating film, 306 for selecting an added region of a catalytic element is first formed. Then a solution containing nickel (Ni) as a catalytic element for facilitating crystallization of the first amorphous silicon film 301 is applied by a spin coating method, and a Ni containing layer 305 is formed (FIG. 3B).

Incidentally, as the catalytic element, cobalt (Co), iron (Fe), palladium (Pd), platinum (Pt), copper (Cu), gold (Au), germanium (Ge), lead (Pb), indium (In), and the like may be used other than nickel.

Moreover, the adding step of the catalytic element is not limited to the spin coating method, but an ion implantation method using a resist mask or a plasma doping method may be used. In this case, since it is easy to lower an occupied area of an added region and to control a growth distance of a lateral growth region, the latter method becomes an effective technique when a minute circuit is constituted.

Figure 3C:
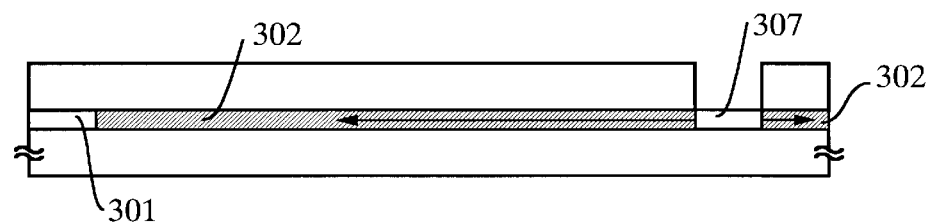

Next, after the adding step of the catalytic element is ended, dehydrogenating at about 450° C. for 1 hour is carried out, and then, a heat treatment in an inert gas atmosphere, a hydrogen atmosphere, or an oxygen atmosphere at a temperature of 500 to 700° C. (typically 550 to 650° C.) for 4 to 24 hours is carried out so that the first amorphous silicon film 301 is crystallized. In this embodiment, a heat treatment in a nitrogen atmosphere at 570° C. for 14 hours is carried out (FIG. 3C).

At this time, crystallization of the first amorphous silicon film 301 is progressed first from nuclei produced in the region 307 where nickel was added, and a crystal region 302 grown in almost parallel to the substrate surface of the substrate 300 is formed. The present inventors refer to the first crystal region 302 as a lateral growth region. Since respective crystals in the lateral growth region 302 are collected in a comparatively uniform state, the region has a merit that total crystallinity is superior. However, in this embodiment, the entire surface of the amorphous silicon film is not crystallized as in Embodiment 2, but there are also portions that are not crystallized. That is, only necessary portions are selectively crystallized, and the amount of added nickel is suppressed to a minimum necessary amount.

Figure 3D:
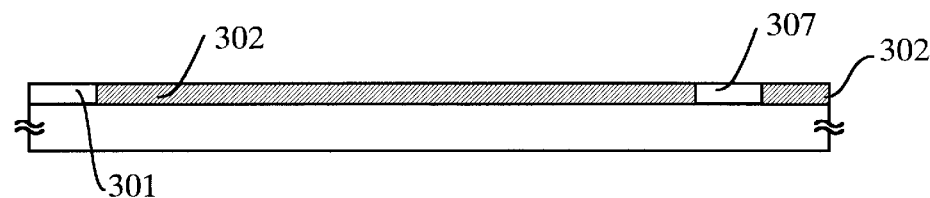

It is preferable to add a step of removing the nickel containing layer remaining on the first crystalline silicon film by a chlorine-based etchant after the heat treatment for the crystallization is ended. The mask insulating film 306 was removed by buffer hydrofluoric acid (FIG. 3D).

Figure 3E:
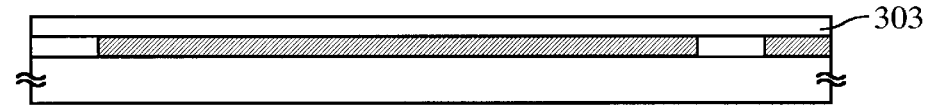

Then a second amorphous silicon film 303 with a thickness of 20 to 100 nm, typically 20 to 60 nm, in this embodiment, 25 nm was formed by a plasma CVD method on the first crystalline silicon film or the first crystalline silicon film in which the oxide film on the surface was removed (FIG. 3E). Although it is preferable that this second amorphous silicon film is obtained under the same manufacturing condition as the first amorphous silicon film, the condition is not particularly limited, but a different manufacturing step may be adopted.

Thereafter, a laser crystallizing process was carried out. As to laser light, it is preferable to use a pulse oscillation laser having a wavelength not longer than an ultraviolet region. For example, it is preferable to use a KrF excimer laser or a XeCl excimer laser. In this embodiment, the XeCl excimer laser (wavelength 308 nm) is used. The energy density of a linear laser beam on an irradiated surface is 100 to 500 mJ/cm$^2$, preferably 130 to 300 mJ/cm$^2$, in this embodiment, 180 mJ/cm$^2$, and irradiation is made to carry out crystallization.

At the irradiation of the laser light, a step of heating a sample (substrate) or an irradiated surface at a temperature ranging from 400° C. to the distortion point of the glass substrate, or at a temperature ranging from 400° C. to the crystallization temperature of the amorphous silicon film may be added. It is desirable that the temperature of this step is made as high as possible.

Figure 3F:
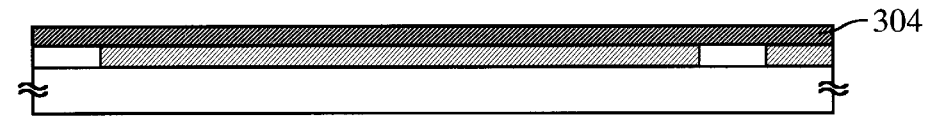

Through the above steps, an excellent second crystalline silicon film 304 having a film surface with few ridges was obtained on the lateral growth region 302 (FIG. 3F).

Here, as compared with Embodiment 2, nickel existing as an impurity in the first crystalline silicon film (lateral growth region 302) is less, and impurities (nickel etc.) are hardly contained in the second crystalline silicon film 304, so that a semiconductor layer with excellent device characteristics can be obtained. The crystal growth of the second crystalline silicon film 304 is carried out using the portion (lateral growth region 302), which is crystallized on the surface of the silicon film of the under layer, as the nuclei of the crystal growth. Although the second crystalline silicon film 304 is influenced from the surface of the lateral growth region 302, since the crystallizing method is different, the crystal structure is different. Especially, in the crystals of the lateral growth region 302, the structure of crystal lattices is such that the crystal lattices are continuous in almost a specific direction to grow into thin rod-like crystals or thin flattened rod-like crystals are grown. On the other hand, the second crystalline silicon film has a crystal structure similar to the crystal structure shown in FIG. 14B.

Embodiment 4

Figure 4A:
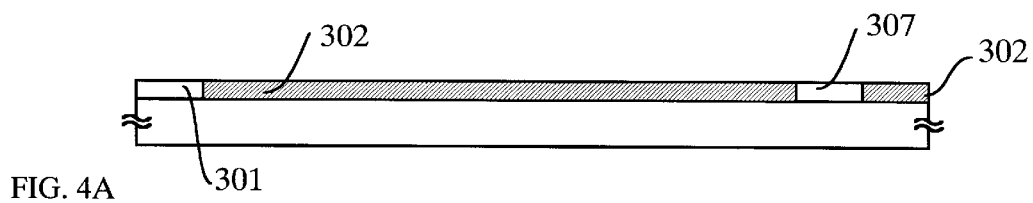
FIGS. 4A to 4G are views showing manufacturing steps of Embodiment 4.
Figure 4B:
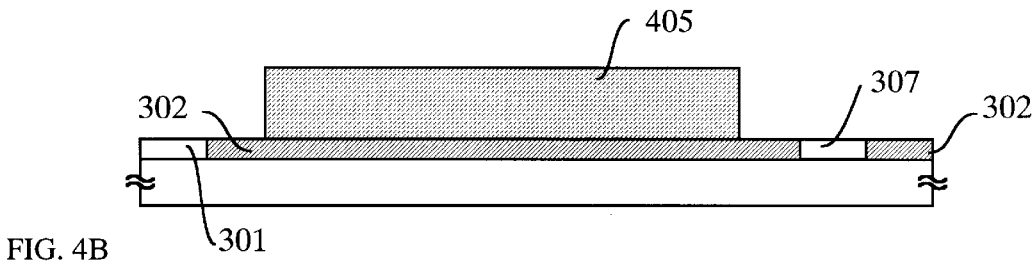
Figure 4C:
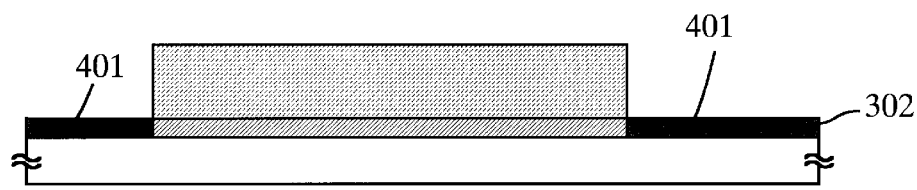
Figure 4D:
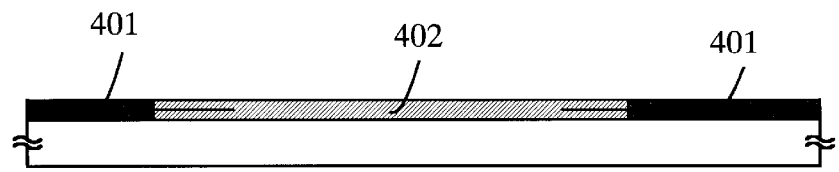

In this embodiment, an example in which nickel elements are gettered by using phosphorus elements after the first crystalline silicon film is obtained in the foregoing Embodiment 3, will be described with reference to FIGS. 4A to 4G. FIG. 4D is equivalent to FIG. 3D of Embodiment 3. Since steps up to the step of obtaining the first crystalline silicon film are the same as Embodiment 3, their explanation will be omitted. Although the description is made with reference to FIGS. 4A to 4G, as the need arises, the foregoing reference numerals will be used for the description.

After a lateral growth region 302 is obtained, catalytic elements used for crystallization are reduced by gettering means using phosphorus (heat treatment at 500 to 700° C.) (Japanese Patent Laid-Open No. 10-247735 having U.S. patent application Ser. No. 09/034,041 corresponding thereto, which are herein incorporated by reference).

In the case where the phosphorus elements is used, phosphorus is added in a region other than the region to be an active layer. Reference numeral 401 denotes a region where phosphorus was added. As a method of adding phosphorus, as shown in FIG. 4B, a resist 405 covering the region to be an active layer is first formed. Next, phosphorus ions are injected by an ion doping method or by applying a solution by spin coating (FIG. 4C).

Thereafter, a heat treatment at a temperature of 400 to 1050° C. (preferably 600 to 750° C.) for 1 min to 20 hr (typically 30 min to 3 hr) is carried out (FIG. 4D). Since the catalytic elements are gettered by this heat treatment into the region where phosphorus was added, the concentration of the catalytic elements in the active layer is lowered to 5 ×10$^{17}$ atoms/cm$^3$ or less. The concentration of these elements is defined as the minimum value of measured values by a SIMS (Secondary Ion Mass Spectroscopy).

Figure 4E:
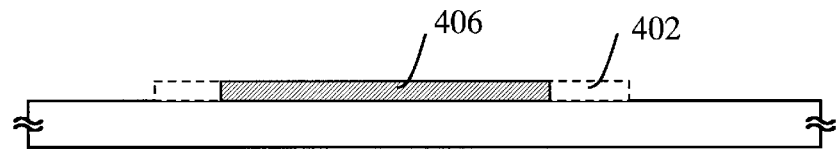
Figure 4F:
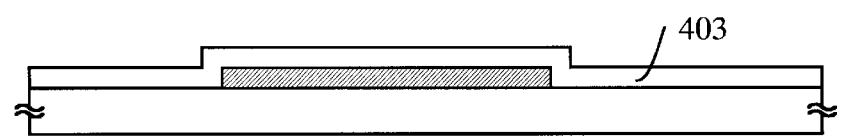

After the gettering step is ended in this way, an island region 406 of the first crystalline silicon film to be a crystal nuclei, is formed by using a region 402 other than the region where phosphorus is added (FIG. 4E).

Figure 4G:
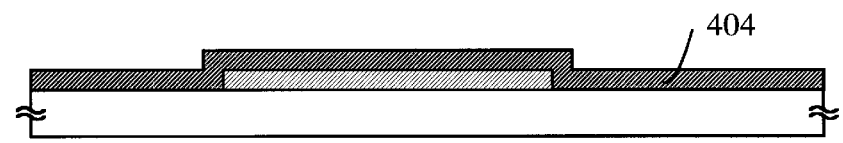

Thereafter, in accordance with steps of Embodiment 3, a second amorphous silicon film 403 is formed (FIG. 4F), and crystallization of this second amorphous silicon film is carried out by laser irradiation, so that a second crystalline silicon film 404 having a surface with few ridges and having excellent crystallinity is obtained (FIG. 4G). With respect to the second crystalline silicon film obtained here, as compared with Embodiments 2 and 3, the crystalline silicon film of the first layer has little nickel existing as an impurity, and the crystalline silicon film of the second layer does not contain impurities, so that a semiconductor layer with excellent device characteristics can be obtained. The crystal growth of the second crystalline silicon film is carried out while the portion crystallized on the surface of the island region 406 of the first crystalline silicon film serving as the under layer is used as nuclei of the crystal growth.

As other means for gettering nickel elements, a heat treatment (at 700° C. to 1000° C.) in an atmosphere containing halogen elements (Japanese Patent Laid-open No. Hei. 10-135468 having U.S. patent application Ser. No. 08/951,193 corresponding thereto, which are herein incorporated by reference) may be carried out to reduce the catalytic elements.

Embodiment 5

Embodiment 5 is an example in which a first crystalline silicon film or a lateral growth region obtained in the above embodiments 1 to 3 is patterned, so that an island region of the first crystalline silicon film to be crystal nuclei is formed. Although it is not preferable to add a patterning step between a first crystallizing process step and a film growth step of a second amorphous silicon film since impurities in the surface of the first crystalline silicon film are increased by the addition, so that it is preferable to remove impurities by adding an etching step. In this embodiment, in the case where the island region of the first crystalline silicon film to be the crystal nuclei is formed, the second amorphous silicon film can be selectively crystallized. Thus, since the region regarded as single crystal or region regarded as substantially single crystal can be selectively utilized as crystal nuclei, a second crystalline silicon film having excellent crystallinity can be obtained at a required portion. Thus, the entire surface of the second crystalline silicon film obtained in this embodiment does not have uniform crystallinity.

Embodiment 6

Embodiment 6 is an example in which a second crystalline silicon film is obtained by using an infrared lamp instead of laser light in the above Embodiments 1 to 5. In the case where infrared rays are used, a silicon film can be selectively heated without heating a substrate very much. Thus, an effective heat treatment can be carried out without giving thermal damages to the substrate.

Embodiment 7

In this embodiment, although a thin film transistor is completed by using a first crystalline silicon film (or a lateral growth region) and a second crystalline silicon film obtained in the foregoing respective embodiments, steps shown in this embodiment are nothing more than one example, and it is needless to say that the present invention is not limited to the steps of this embodiment. Incidentally, the description will be made with reference to FIGS. 5A to 5D and FIGS. 6A to 6C, and as the need arises, the foregoing reference numerals will be used for the description.

Figure 5A:
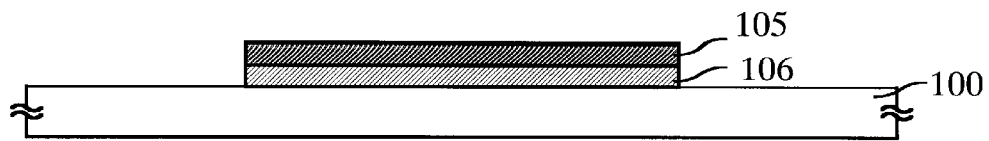
FIGS. 5A to 5D are views showing manufacturing steps of Embodiment 7.

First, a first crystalline silicon film (or a lateral growth region) and a second crystalline silicon film obtained in the above respective embodiments are patterned as shown in FIG. 5A, so that a first island-like semiconductor layer 106 and a second island like semiconductor layer 105 is formed.

Figure 5B:
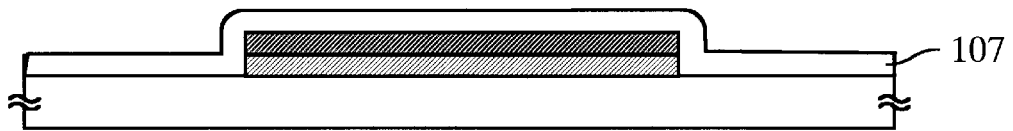

Next, as shown in FIG. 5B, a silicon oxide film functioning as a gate insulating film 107 is formed. This silicon oxide film is formed by using a plasma CVD method or a sputtering method. In this embodiment, its film thickness is 150 nm.

Thereafter, a step of obtaining a silicon oxide film by carrying out a thermal oxidation step may be added.

Figure 5C:
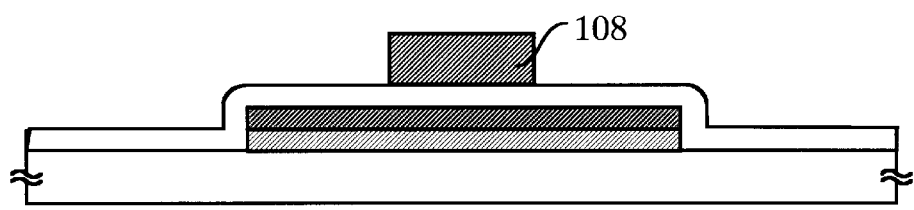

Further, a film of a material consisting from aluminum or containing aluminum as its main ingredient (in this embodiment, an aluminum film containing scandium of 2 wt %) is formed and is patterned to form an original 108 of a gate electrode/wiring (FIG. 5C). The gate wiring may be made of silicon, metal such as tungsten or titanium, or silicide of those. It is appropriate that a material of the gate electrode is determined according to required characteristics of a semiconductor circuit, heat resistance temperature of a substrate, or the like. In this embodiment, the film thickness is 400 nm.

Figure 5D:
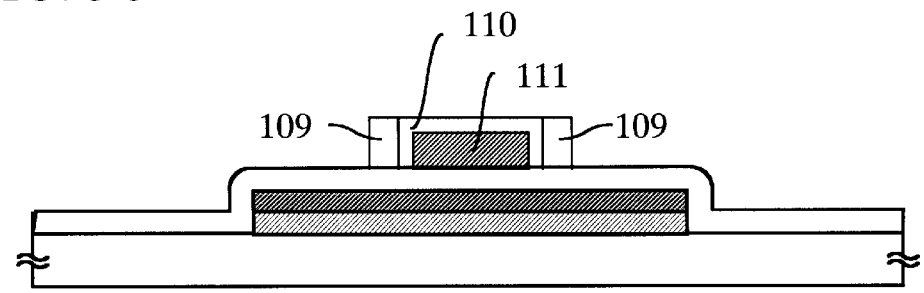
Figure 6A:
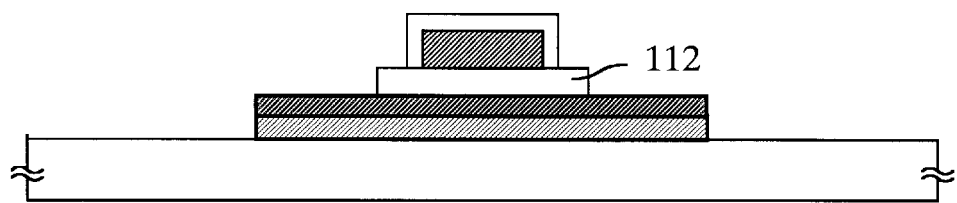
FIGS. 6A to 6C are views showing manufacturing steps of Embodiment 7.

Next, a porous anodic oxidation film 109 and a nonporous anodic oxidation films 110 are formed by a technique disclosed in Japanese Patent Laid-open No. Hei. 7-135318 having U.S. Pat. No. 5,648,277 corresponding thereto, which are herein incorporated by reference (FIG. 5D). Then the gate insulating layer 107 is etched by using these anodic oxidation films and the gate electrode 111 as masks, so that a gate insulating film 112 is formed. Thereafter, the porous anodic oxide film 109 is removed (FIG. 6A).

Figure 6B:
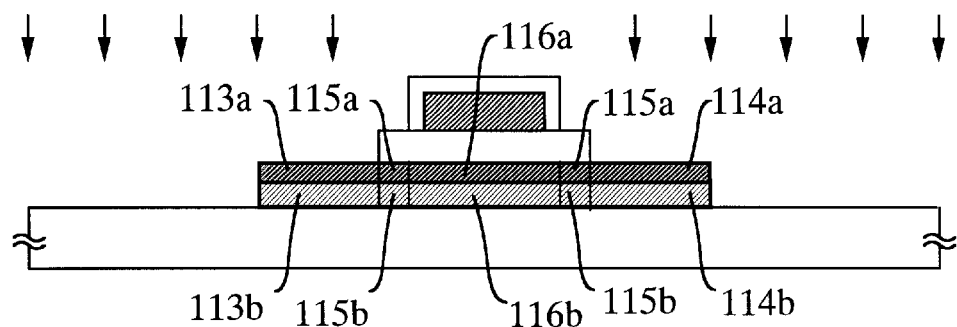

Thereafter, N-type or P-type impurities are introduced into the silicon island by an ion doping method or the like in a self-aligning manner, so that two-layer channel formation regions 116a and 116b, two-layer low concentration impurity regions 115a and 115b, two-layer source regions 113a and 113b, and two-layer drain regions 114a and 114b are formed (FIG. 6B).

Figure 6C:
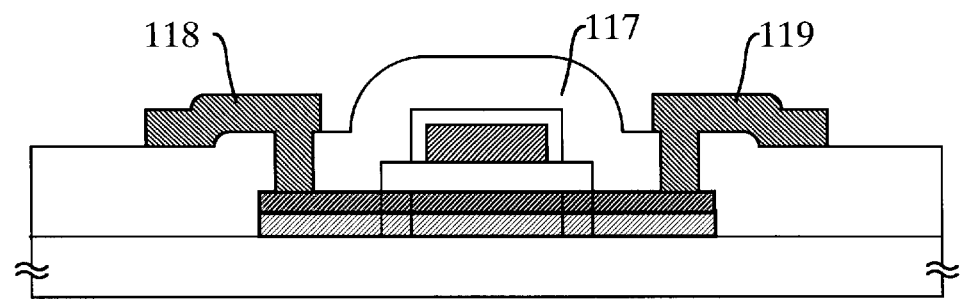

Then an interlayer insulating film 117 is deposited by a well-known means. In this embodiment, its film thickness is 900 nm. Contact holes are formed in this film and aluminum alloy wiring is formed so that a source electrode 118 and a drain electrode 119 are obtained. Finally, a heat treatment at about 350° C. for one hour is carried out in a hydrogen atmosphere, so that hydrogenating of the whole component is carried out. In this way, a thin film transistor (TFT) is completed (FIG. 6C).

Further, such a structure may be adopted that a silicon nitride film or the like with a thickness of 10 to 50 nm is deposited as a protective film (passivation film) on the foregoing transistor by a plasma CVD method, contact holes communicating with wiring of an output terminal are bored in this film, and the wiring is formed.

Embodiment 8

In the embodiment, description will be made on an example of steps for manufacturing a reflection type liquid crystal panel using a semiconductor device obtained by practicing Embodiment 7.

Figure 7:
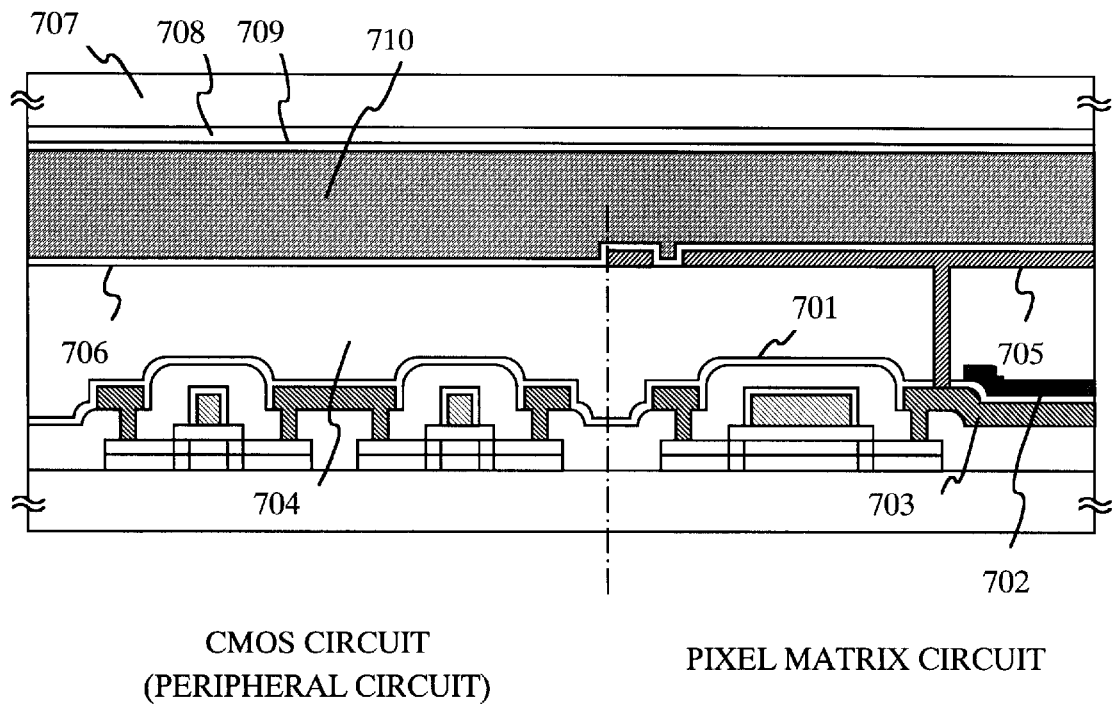
FIG. 7 is a view showing a section of an active matrix substrate of Embodiment 8.

A crystalline silicon film having a two-layer structure is manufactured in accordance with manufacturing steps described in Embodiments 1 to 6. FIG. 7 is a sectional view of an active matrix type liquid crystal panel, and shows a CMOS circuit in a region constituting a driver circuit or a logic circuit, and a pixel TFr in a region constituting a pixel matrix circuit.

The CMOS circuit is manufactured by complementarily combining an N-channel TFT and a P-channel TFr. Since the structure and manufacturing method of the respective TFTs constituting the CMOS circuit has been explained in Embodiment 7, their explanation will be omitted.

With respect to the pixel TFT, it is necessary to add further contrivance to the TFT constituting a driver circuit or the like. In FIG. 7, reference numeral 701 denotes a silicon nitride film, which is used also as a passivation film of the CMOS circuit and at the same time, functions as an insulator constituting an auxiliary capacitance.

A titanium film 702 is formed on the silicon nitride film 701, and the auxiliary capacitance is formed between the titanium film 702 and the drain electrode 703. At this time, since the insulator is the silicon nitride film having a high relative dielectric constant, the capacitance can be made large. Since it is not necessary to take an aperture ratio into consideration in the reflection type, there is no problem even when a structure as shown in FIG. 7 is adopted.

Reference numeral 704 denotes an interlayer insulating film made of an organic resin film, and polyimide is used in this embodiment. It is preferable that the thickness of the interlayer insulating film is made as thick as about 2 $\mu$m to secure sufficient flatness. By doing so, a pixel electrode 705 having superior flatness can be formed.

The pixel electrode 705 is formed of a material consisting from aluminum or containing aluminum as its main ingredient. It is appropriate that a material having the highest possible reflectivity is used. When the excellent flatness is secured, loss due to diffused reflection on the surface of the pixel electrode can be decreased.

An orientation film 706 is formed on the pixel electrode 705. The orientation film 706 is made to have orienting force by rubbing. The above is the description on the structure of a TFT side substrate (active matrix substrate).

Figure 8:
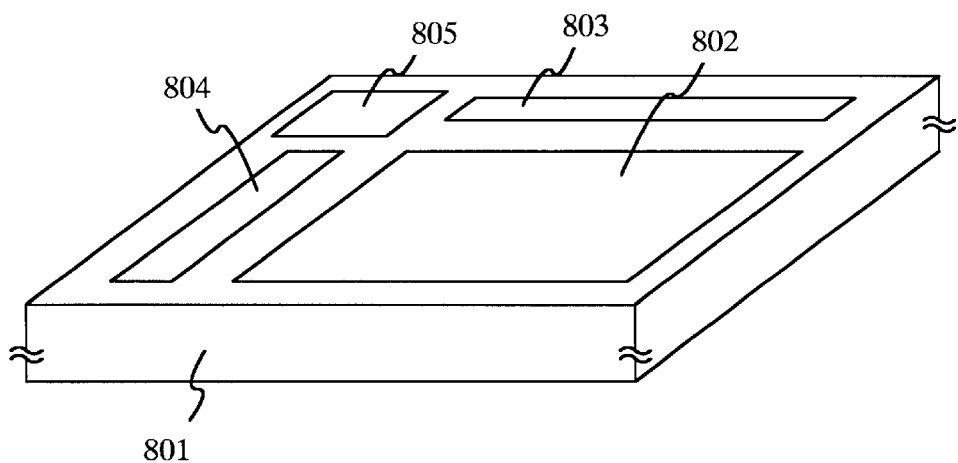
FIG. 8 is a view showing an outer appearance of the active matrix substrate of Embodiment 8.

On the other hand, an opposite substrate is constituted by forming a transparent conductive film 708 and an orientation film 709 on a transmissive substrate 707. As the need arises, a black mask or a color filter may be provided other than those. After spacers are distributed and seal material printing is carried out, a liquid crystal layer 710 is sealed so that a reflection type liquid crystal panel having a structure shown in FIG. 7 is completed. The liquid crystal layer 710 can be freely selected according to the operation mode (ECB mode, guest host mode, etc.) of a liquid crystal. FIG. 8 schematically shows an outer appearance of the active matrix substrate constituting the reflection type liquid crystal panel as shown in FIG. 7. In FIG. 8, reference numeral 801 denotes a silicon substrate on which a thermal oxidation film is provided in accordance with the steps of Embodiment 1, 802 denotes a pixel matrix circuit, 803 denotes a source driver circuit, 804 denotes a gate driver circuit, and 805 denotes a logic circuit.

Although the logic circuit 805 includes all logical circuits constituted by TFTs in a wide sense, in order to differentiate the logic circuit from circuits conventionally called a pixel matrix circuit and a driver circuit, the term here indicates signal processing circuits (memory, D/A converter, clock generator, etc.) other than those.

An FPC (Flexible Print Circuit) terminal as an external terminal is attached to the thus formed liquid crystal panel. What is called as a liquid crystal module in general is a liquid crystal panel in the state where an FPC is attached.

Embodiment 9

In this embodiment, an example of steps of manufacturing a transmission type liquid crystal panel, which uses a crystalline silicon film having a two-layer structure and obtained in Embodiments 1 to 6 and uses a TFT manufactured in Embodiment 7, will be described.

However, since the basic structure is the same as the reflection type liquid crystal panel described in Embodiment 7, different points in structure will be particularly described.

Figure 9:
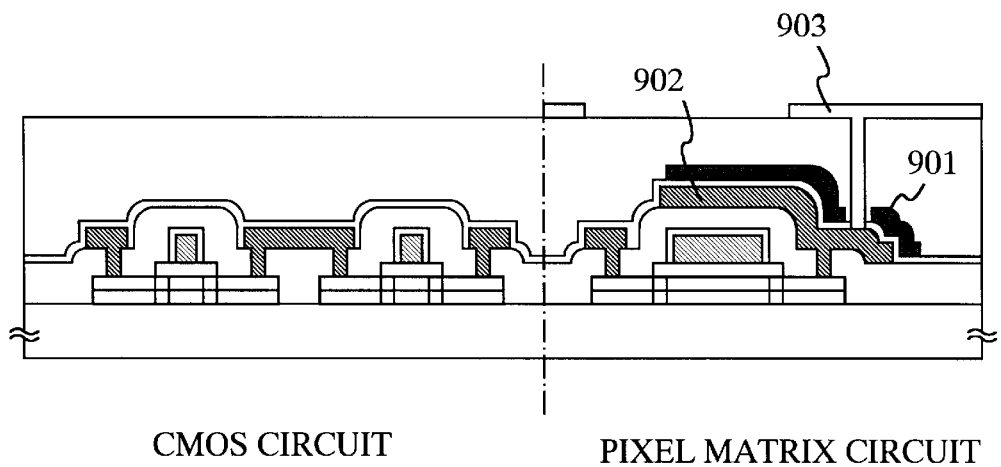
FIG. 9 is a view showing a section of an active matrix substrate of Embodiment 9.

In the case of the transmission type liquid crystal panel shown in FIG. 9, the structure of a black mask 901 is greatly different from the reflection type liquid crystal panel. That is, since a sufficient aperture ratio is required in the transmission type, it is important to make such a structure that the black mask does not overlap to the utmost at portions other than a TFT portion and a wiring portion.

Thus, in this embodiment, a drain electrode 902 is formed so as to overlap with an upper portion of the TFT portion, and an auxiliary capacitance is formed between the drain electrode and the black mask 901. Like this, when the auxiliary capacitance, which is apt to occupy a wide area, is formed over the TFT, it is possible to widen the aperture ratio.

Reference numeral 903 denotes a transparent conductive film to be a pixel electrode. As the transparent conductive film 903, although ITO is most frequently used, other material (tin oxide based materials, etc.) may be used.

Embodiment 10

This embodiment is an example in which the present invention is applied to a so-called silicon gate TFT in which a silicon film having conductivity is used as a gate electrode. A panel of this embodiment is manufactured by using a two-layer crystalline silicon film described in Embodiment 1. Since the basic structure is almost the same as the TFT manufactured in Embodiment 7, explanation will be made while paying attention to only differences.

Figure 10:
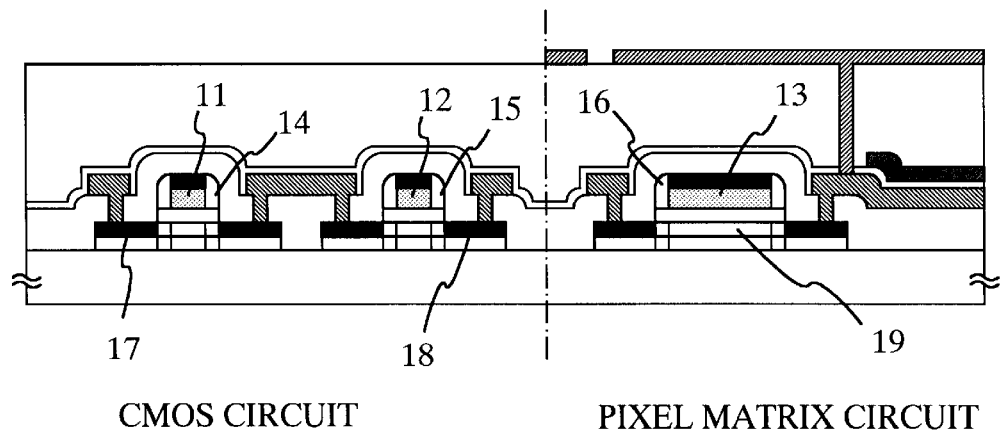
FIG. 10 is a view showing a section of an active matrix substrate of Embodiment 10.

In FIG. 10, reference numeral 11 denotes a gate electrode of an N-channel TFr, 12 denotes a gate electrode of a P-channel TFT, and 13 denotes a gate electrode of a pixel TFT. The gate electrodes 11 to 13 are made of N-type polysilicon films added with phosphorus or arsenic, or P-type polysilicon films added with boron or indium.

In the CMOS circuit, it is also possible to constitute a dual gate type CMOS circuit in which an N-type polysilicon gate is used for an N-channel TFT and a P-type polysilicon gate is used for a P-channel TFT. Reference numeral 17 denotes a part of a source region of the second crystalline silicon film in the two-layer structure crystalline silicon film, which has the surface with few ridges and is added with an impurity to give an N type. Reference numeral 18 denotes a part of a drain region of the second crystalline silicon film in the two-layer structure crystalline silicon film, which has the surface with few ridges and is added with an impurity to give a P type. Reference numeral 19 denotes a part of a channel region using the second crystalline silicon film having the surface with few ridges in the two-layer structure crystalline silicon film.

As merits of using the silicon film as a gate electrode like this, it is possible to enumerate such features that heat resistance is high, and handling is easy because of the silicon film. Moreover, by using a reaction with a metal film, a salicide structure (including a polycide structure) can be adopted.

For that purpose, after the gate electrodes 11 to 13 are formed, side walls 14 to 16 are formed, a metal film (not shown) of titanium, tungsten, or the like is formed, and a heat treatment is carried out to form metal silicide. In FIG. 10, this metal silicide is formed in the source region 17, the drain region 18, and part of the gate electrodes.

A structure in which metal silicide is formed in a self-aligning manner by using a side wall or the like in this way is called a salicide structure. It is effective to adopt such a structure since an ohmic contact with a lead electrode (source/drain electrode, etc.) becomes excellent.

Embodiment 11

Although an example of a top gate type TFT structure has been described in Embodiments 1 to 4, in this embodiment, as other TFT structures, an example of a bottom gate type TFT will be described. Such a structure is effective since an ohmic contact between a surface of an active layer with few ridges, which is made of a second crystalline silicon film, and a lead electrode (source/drain electrode, etc.) becomes excellent. Moreover, since the surface of the active layer has few ridges, there are few traps and an electric property of high on/off ratio can be obtained.

A process of Embodiment 11 is shown in FIGS. 11A–11E, and 12A–12B. First, an under film (not shown) made of an insulating film containing silicon as its main ingredient is formed on a glass substrate 1100 (or quartz, or silicon substrate). A gate electrode (first wiring) made of a conductive film is formed thereon. Here, a first patterning step (formation of a gate electrode 1101) is carried out.

It is preferable that the thickness of the gate electrode 1101 is 200 to 500 nm. In this embodiment, the gate electrode was formed by using a Ta film with a thickness of 300 nm. As the gate electrode 1101, it is possible to use a material (tantalum, tungsten, titanium, chromium, molybdenum, conductive silicon, conductive polysilicon, etc.) having such heat resistance that the material can resist against at least a temperature of about 600° C.

Figure 11A:
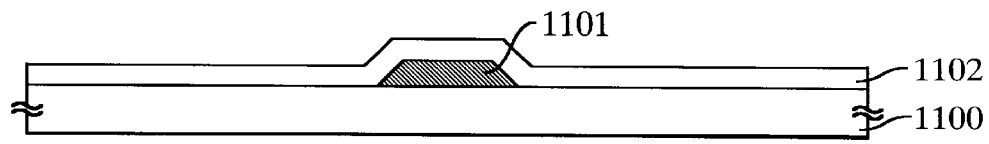
FIGS. 11A to 11E are views showing manufacturing steps of Embodiment 11.
Figure 11B:
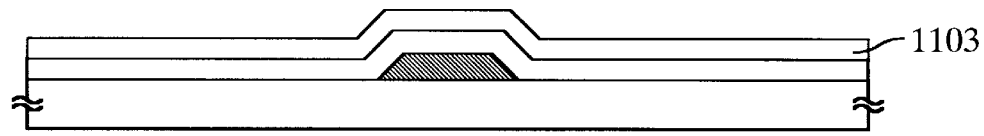
Figure 11C:
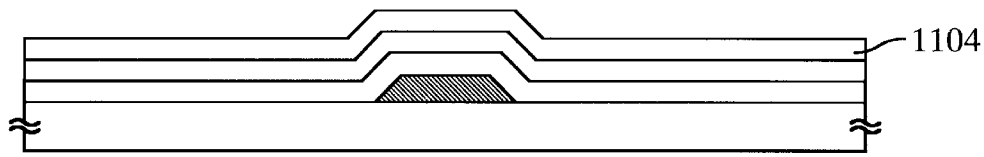

Next, a gate insulating layer 1102 made of a silicon nitride film, a silicon nitride oxide film indicated by SiOxNy, or a silicon oxide film (it is preferable that the film thickness is 10 to 200 nm, and in this embodiment, a silicon nitride oxide film with a thickness of 125 nm, which is formed by using a plasma CVD method with mixture of TEOS of organic silane and oxygen, is used) is formed (FIG. 11A).

After this step, like Embodiments 1 to 3, film formation and heating crystallization of a first amorphous silicon film (FIG. 11B) and film formation and laser crystallization of a second amorphous silicon film (FIG. 11C) are carried out, so that a first crystalline silicon film 1103 and a second crystalline silicon film 1104 with few ridges are obtained.

Figure 11D:
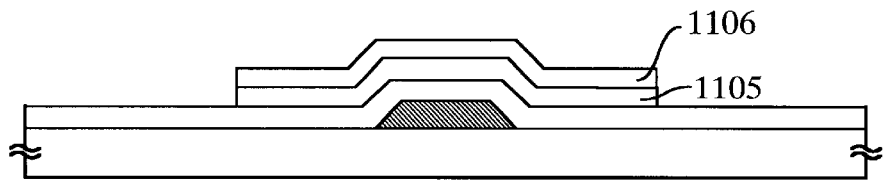

Then, patterning is carried out so that active layers with a desired shape (an active layer 1105 made of the first crystalline silicon film, an active layer 1106 made of the second crystalline silicon film) are obtained (FIG. 11D).

Figure 11E:
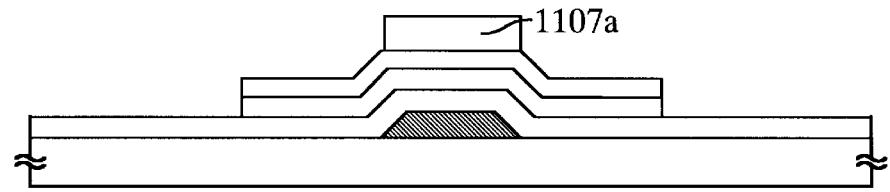

Next, for the purpose of manufacturing a low concentration impurity region, a silicon oxide film (the film thickness is preferably 100 to 300 nm, in this embodiment, 150 nm) is formed to cover the active layer 1106 made of the second crystalline silicon film, and then, patterning is carried out so that a doping mask 1107a for forming a channel formation region is formed (FIG. 11E).

Figure 12A:
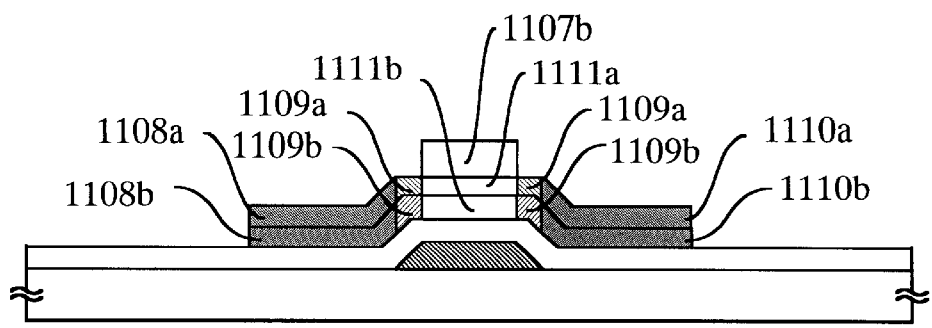
FIGS. 12A and 12B are views showing manufacturing steps of Embodiment 11.

Although the low impurity region and high impurity region may be manufactured by using any well-known method, in this embodiment, by using the doping mask 1107a, the first doping is carried out through a well known method (for example, an ion doping method), and by using a doping mask 1107b in which patterning is again applied to the doping mask 1107a, the second doping is carried out by a well-known method (for example, an ion doping method). In this way, low impurity regions 1109a and 1109b, source regions 1108a and 1108b, drain regions 1110a and 1110b, and channel regions 1111a and 1111b are manufactured (FIG. 12A).

In the case where a TFT having a low resistance region and a high resistance impurity region is manufactured, although the low resistance region and the high resistance impurity region may be manufactured by any well-known method, it is preferable to use such a method that doping of impurity ions is carried out while a doping mask is used as a mask, and then, irradiation of laser light is carried out from the rear surface of a substrate while a gate electrode is used as a mask to activate the impurity ions, so that the low resistance region and the high resistance impurity region are manufactured.

Figure 12B:
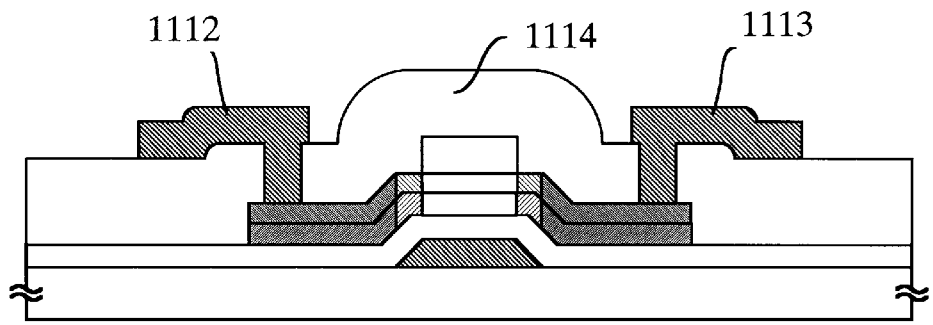

Thereafter, a protective film (an interlayer insulating film 1114) is formed, and a lead wiring electrode of the gate electrode and lead wiring electrodes 1112 and 1113 of the source/drain are formed, so that a (N-channel or P-channel) bottom gate type polysilicon thin film transistor is completed. This protective film may be constituted by a silicon nitride film, a silicon oxide film, an organic resin film, or a laminated film of those (FIG. 12B).

Embodiment 12

Although an example of a bottom gate type TFT structure has been described in Embodiment 11, in this embodiment, as another TFT structure, an example of a channel etch type TFT will be described. The main difference from Embodiment 11 is that a doping mask is not provided.

This embodiment uses the same steps as those of Embodiment 11 up to the step shown in FIG. 11D [an under film having insulation properties is formed on a glass substrate 1300 (or a quartz substrate), a gate electrode 1301 made of a conductive film is formed thereon, a gate insulating layer 1302 is formed thereon, crystalline silicon films (1303, 1304) of two layers formed by different crystallizing methods are stacked thereon, and patterning is carried out].

Although not shown in the drawing, a part of the exposed gate insulating layer 1302 is etched to bore a contact hole for electrically connecting the gate electrode 1301 to a subsequently formed electrode.

Next, a metal film having conductivity is formed, and a source electrode 1305 and a drain electrode 1306 are formed by patterning. In this embodiment, a laminated film made of three-layer structure of Ti (50 nm)/Al (200 to 300 nm)/Ti (50 nm) is used. As described above, a wiring line for electrical connection to the gate electrode 1301 is also formed at the same time.

Here, a region just above the gate electrode, that is, a region 1308 (hereinafter referred to as a channel etch region) placed between the source electrode and the drain electrode is later determined depending upon the length of a channel formation region and an offset region.

Next, dry etching is carried out by using the source electrode 1305 and the drain electrode 1306 as masks, so that an island is etched in a self-aligning manner. At this time, in this embodiment, only a semiconductor layer with a thickness of 10 to 100nm (typically 10 to 75 nm, preferably 15 to 45 nm) is left. In this embodiment, a semiconductor layer (corresponding to reference numeral 1308) with a thickness of 30 nm was left.

In this way, when etching (channel etch step) of the island is ended, a silicon oxide film, a silicon nitride film, or an organic resin film is formed as a protective film 1307, and a TFT is completed. This protective film may be constituted by a laminated film.

In this state, in the island which was subjected to the channel etch, a region just above the gate electrode becomes the channel formation region. A region positioned outside of the end of the gate electrode, to which an electric field from the gate electrode is not applied, and becomes an offset region.

Figure 13:
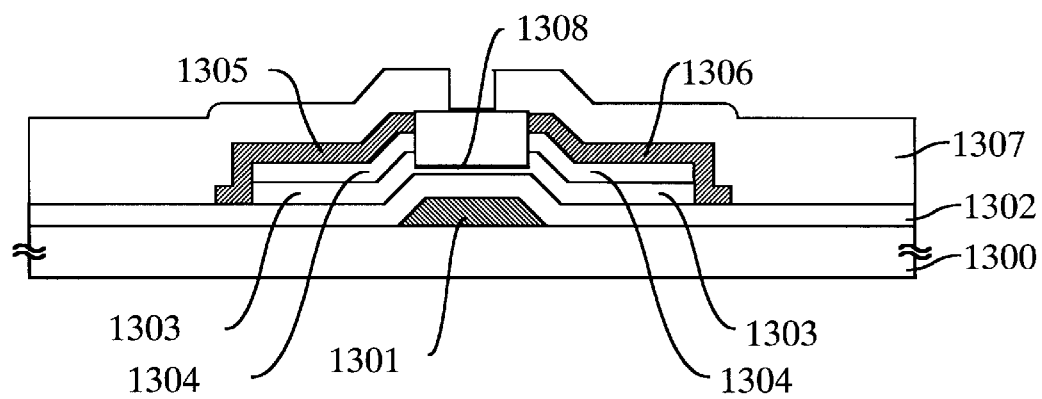
FIG. 13 is a view showing a section of a TFT structure of Embodiment 12.

Through the above steps, the structure (channel etch structure) as shown in FIG. 13 is obtained.

Embodiment 13

Since a TFT of the present invention uses a semiconductor thin film, which is regarded as substantially single crystal, for an active layer, it shows electric characteristics comparable to a MOSFET using single crystal silicon.

The TF obtained in the present invention has very excellent switching characteristics and high speed operation characteristics. Thus, it becomes possible to constitute an integrated circuit such as an LSI, by TFTs, which is conventionally constituted by MOSFETs.

Moreover, it also becomes possible to constitute a three-dimensional structure semiconductor device (semiconductor circuit) by actively using the merits of a TFT using a thin film.

When a semiconductor circuit of three-dimensional structure is constituted by using TFTs of the present invention, it is possible to constitute the semiconductor circuit having very rich functionality. Incidentally, in the present specification, the term "semiconductor circuit" is used to mean an electric circuit for controlling and changing electric signals by using semiconductor properties.

Moreover, it is also possible to constitute an LCD driver circuit or a high frequency circuit (MMIC: Microwave Module IC) for a portable equipment by using TFs of the present invention. That is, if the TFTs of the present invention are used, it is possible to manufacture a conventional IC chip or LSI chip with the TFTs.

Embodiment 14

According to the present invention, other than the liquid crystal display device, it is also possible to manufacture other electro-optical devices such as an active matrix type EL (electroluminescence) display device and an EC (electrochromic) display device. It is also possible to manufacture an image sensor or a CCD.

Incidentally, the term "electro-optical device" is used to mean a device for converting an electric signal to an optical signal or a device for carrying out the reverse conversion.

Embodiment 15

In this embodiment, examples of electronic apparatuses (applied products) using electro-optical devices of the present invention will be described with reference to FIGS. 15A to 15F. Incidentally, the electronic apparatus means a product incorporating a semiconductor circuit and/or electro-optical device.

As electronic apparatuses to which the present invention is applied, a video camera, an electronic still camera, a projector, a head mount display, a car navigation system, a personal computer, a portable information terminal (mobile computer, portable telephone, PHS (Personal Handyphone System) etc.) and the like are enumerated.

Figure 15A:
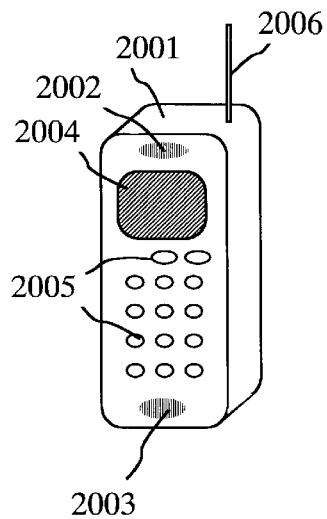
FIGS. 15A to 15F are views showing examples of electronic apparatuses of Embodiment 13.

FIG. 15A shows a portable telephone which is constituted by a main body 2001, an audio output portion 2002, an audio input portion 2003, a display device 2004, an operation switch 2005, and an antenna 2006. The present invention can be applied to the audio output portion 2002, the audio input portion 2003, the display device 2004, and the like.

Figure 15B:
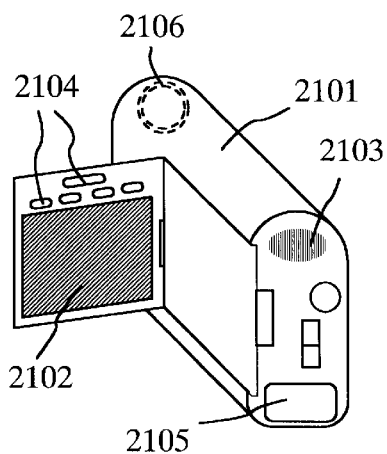

FIG. 15B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, the image receiving portion 2106, and the like.

Figure 15C:
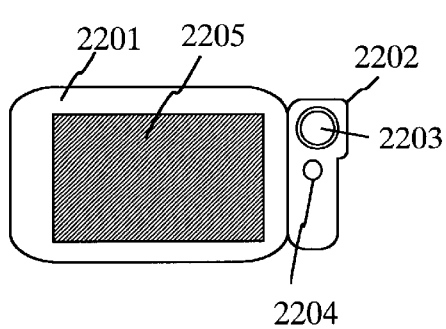

FIG. 15C shows a mobile computer which is constituted by a main body 2201, a camera portion 2202, an image receiving portion 2203, an operation switch 2204, and a display device 2205. The present invention can be applied to the camera portion 2202, the image receiving portion 2203, the display device 2205, and the like.

Figure 15D:
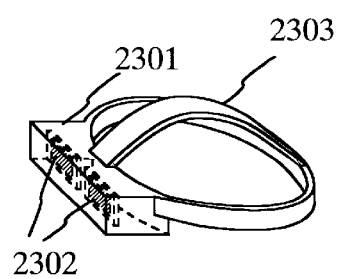

FIG. 15D shows a head mount display which is constituted by a main body 2301, a display device 2302, and a band portion 2303. The present invention can be applied to the display device 2302.

Figure 15E:
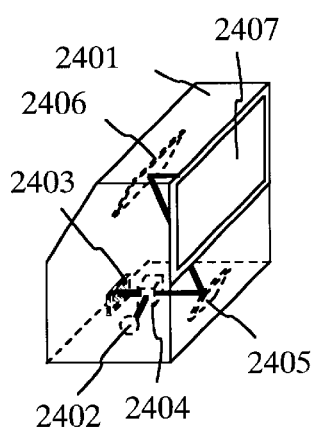

FIG. 15E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 15F:
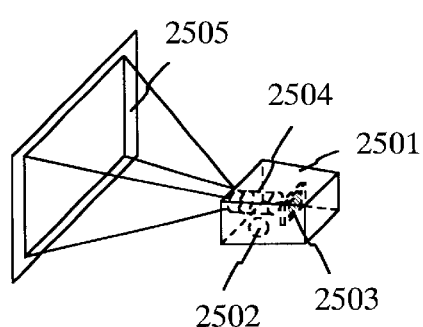

FIG. 15F shows a front type projector which is constituted by a main body 2501, a light source 2502, a display device 2503, an optical system 2504, and a screen 2505. The present invention can be applied to the display device 2503.

As set forth above, the scope of application of the present invention is extremely broad and the present invention can be applied to electronic apparatuses of any field. Moreover, the present invention can be applied to any product if the product requires an electro-optical device or a semiconductor circuit.

As described above, according to the present invention, a first crystalline silicon film is formed by using a well-known crystallizing means, a second amorphous silicon film is formed on the obtained first crystalline silicon film as an under film, and the second amorphous silicon film is crystallized by irradiation of laser light or the like, so that a silicon film having excellent crystallinity and a surface with few ridges can be obtained.

As compared with the prior art, since there are few ridges and the flatness of the surface is superior, in a top gate type TFT structure, an interfacial level between a gate insulating film and an active layer can be lowered. Moreover, in a bottom gate type TFT structure, an interfacial level between a source/drain electrode and an active layer can be lowered and an ohmic contact can be made excellent.

Moreover, as compared with an under film of $SiO_2$ or the like, since an under film is the first crystalline silicon film, a critical energy is small. Thus, since crystallization can be made by laser light with an energy density (typically 100 to 300 $mJ/cm^2$) lower than that of the prior art, a process margin is improved.

Moreover, in the structure (the foregoing Embodiments 1 and 2) that after a first crystalline silicon film is obtained, a second amorphous silicon film is crystallized, as compared with the prior art (a second amorphous silicon film is selectively crystallized by using a patterned first crystalline silicon film as seed crystals, and only a second crystalline silicon film is used as an active layer), since laser light can be made to be absorbed uniformly in the amorphous silicon film, it is possible to obtain a silicon film having more uniform crystallinity over the whole surface of the film.

Thus, also in the present invention, the structure (the foregoing Embodiments 1 and 2) in which a second amorphous silicon film is crystallized after a first crystalline silicon film is obtained, is preferable to the structure (the foregoing Embodiments 3 and 5) in which a second amorphous silicon film is selectively crystallized after a first crystalline silicon film is patterned.

Moreover, at the same time as crystallization of the second amorphous silicon film by irradiation of laser light, the film quality of the first crystalline silicon film can also be improved.

Moreover, when these two-layer silicon films are used as an active layer of a thin film transistor, a thin film semiconductor device having higher reliability and superior performance can be obtained.

What is claimed is:

1. A method of manufacturing a semiconductor device including a bottom gate type thin film transistor, said method comprising the steps of:

forming a gate insulating film on the gate electrode;

forming a first amorphous semiconductor film comprising silicon over the gate electrode with the gate insulating film therebetween;

introducing a material being capable of promoting crystallization of silicon on the first amorphous semiconductor film;

forming a first crystalline semiconductor film by heating the first amorphous semiconductor film to crystallize;

forming a second amorphous semiconductor film comprising silicon on the first crystalline semiconductor film;

forming a second crystalline semiconductor film by irradiating with an infrared light to crystallize the second amorphous semiconductor film;

patterning the first and second crystalline semiconductor films to form a crystalline semiconductor island;

introducing an impurity into the crystalline semiconductor island to form a source region, a drain region and a channel region between the source and drain regions; and forming a source electrode and a drain electrode on the crystalline semiconductor island.

2. The method according to claim 1, wherein the material is at least one selected from the group consisting of Fe, Co, Ni, Ru, Rh, Pd, Os, Ir, Pt, Cu, Ag, and Au.

3. The method according to claim 1, wherein the second amorphous semiconductor film is crystallized using a surface of the first crystalline semiconductor film as crystal nuclei.

4. The method according to claim 1, wherein said semiconductor device is at least one of the group consisting of a liquid crystal display device, an EL display device, an EC display device, an image sensor, and a CCD.

5. The method according to claim 1, wherein said semiconductor device is at least one of the group consisting of a video camera, an electronic still camera, a projector, a head mount display, a car navigation system, a personal computer, and a portable information terminal.

6. The method according to claim 1, further comprising:
forming an oxide film on the first amorphous semiconductor film to improve a wettability.

7. The method according to claim 1, further comprising:
etching the first crystalline semiconductor film before the step of forming the second amorphous semiconductor film.

8. A method of manufacturing a semiconductor device comprising:

forming a first semiconductor film comprising amorphous silicon on an insulating surface;

crystallizing the first semiconductor film by a heat treatment in a furnace;

forming a second semiconductor film comprising amorphous silicon film on the crystallized first semiconductor film;

irradiating the second semiconductor film with a laser light for crystallizing the second semiconductor film; and forming a semiconductor island comprising the first semiconductor film and the second semiconductor film.

9. The method according to claim 8, wherein the second amorphous semiconductor film is crystallized with the surface of the first semiconductor film used as a crystal nuclei.

10. The method according to claim 8, wherein said semiconductor device is at least one of the group consisting of a liquid crystal display device, an EL display device, an EC display device, an image sensor, and a CCD.

11. The method according to claim 8, wherein said semiconductor device is at least one of the group consisting of a video camera, an electronic still camera, a projector, a head mount display, a car navigation system, a personal computer, and a portable information terminal.

12. A method of manufacturing a semiconductor device comprising:

forming a first semiconductor film comprising amorphous silicon on an insulating surface;

crystallizing the first semiconductor film by a heat treatment in a furnace;

forming a second semiconductor film comprising amorphous silicon film on the crystallized first semiconductor film;

irradiating the second semiconductor film with an infrared light for crystallizing the second semiconductor film; and forming a semiconductor island comprising the first semiconductor film and the second semiconductor film.

13. The method according to claim 12, wherein the second amorphous semiconductor film is crystallized with the surface of the first semiconductor film used as a crystal nuclei.

14. The method according to claim 12, wherein said semiconductor device is at least one of the group consisting of a liquid crystal display device, an EL display device, an EC display device, an image sensor, and a CCD.

15. The method according to claim 12, wherein said semiconductor device is at least one of the group consisting of a video camera, an electronic still camera, a projector, a head mount display, a car navigation system, a personal computer, and a portable information terminal.

16. A method of manufacturing a semiconductor device comprising:

forming a first semiconductor film comprising amorphous silicon on an insulating surface;

providing the first semiconductor film with a metal containing material for promoting crystallization of silicon;

crystallizing the first semiconductor film by a heat treatment in a furnace;

forming a second semiconductor film comprising amorphous silicon film on the crystallized first semiconductor film;

irradiating the second semiconductor film with a laser light for crystallizing the second semiconductor film; and forming a semiconductor island comprising the first semiconductor film and the second semiconductor film.

17. The method according to claim 16, wherein the second amorphous semiconductor film is crystallized with the surface of the first semiconductor film used as a crystal nuclei.

18. The method according to claim 16, wherein said semiconductor device is at least one of the group consisting of a liquid crystal display device, an EL display device, an EC display device, an image sensor, and a CCD.

19. The method according to claimed 16, wherein said semiconductor device is at least one of the group consisting of a video camera, an electronic still camera, a projector, a head mount display, a car navigation system, a personal computer, and a portable information terminal.

20. A method of manufacturing a semiconductor device comprising:

forming a first semiconductor film comprising amorphous silicon on an insulating surface;

providing the first semiconductor film with a metal containing material for promoting crystallization of silicon;

crystallizing the first semiconductor film by a heat treatment in a furnace;

forming a second semiconductor film comprising amorphous silicon film on the crystallized first semiconductor film;

irradiating the second semiconductor film with an infrared light for crystallizing the second semiconductor film; and forming a semiconductor island comprising the first semiconductor film and the second semiconductor film.

21. The method according to claim 20, wherein the second amorphous semiconductor film is crystallized with the surface of the first semiconductor film used as a crystal nuclei.

22. The method according to claim 20, wherein said semiconductor device is at least one of the group consisting of a liquid crystal display device, an EL display device, an EC display device, an image sensor, and a CCD.

23. The method according to claim 20, wherein said semiconductor device is at least one of the group consisting of a video camera, an electronic still camera, a projector, a head mount display, a car navigation system, a personal computer, and a portable information terminal.

24. A method of manufacturing a semiconductor device comprising:

forming a first semiconductor film comprising amorphous silicon on an insulating surface;

crystallizing the first semiconductor film by a heat treatment in a furnace;

patterning the crystallized first semiconductor film to form a first semiconductor island;

forming a second semiconductor film comprising amorphous silicon film on the first semiconductor island, said second semiconductor film extending beyond side edges of the first semiconductor island so that an upper and side surfaces of the first semiconductor island are covered by the second semiconductor film;

irradiating the second semiconductor film with a laser light for crystallizing the second semiconductor film; and forming a semiconductor island comprising the first semiconductor film and the second semiconductor film.

25. The method according to claim 24, wherein the second amorphous semiconductor film is crystallized with the surface of the first semiconductor film used as a crystal nuclei.

26. The method according to claim 24, wherein said semiconductor device is at least one of the group consisting of a liquid crystal display device, an EL display device, an EC display device, an image sensor, and a CCD.

27. The method according to claim 24, wherein said semiconductor device is at least one of the group consisting of a video camera, an electronic still camera, a projector, a head mount display, a car navigation system, a personal computer, and a portable information terminal.

28. A method of manufacturing a semiconductor device comprising:

forming a first semiconductor film comprising amorphous silicon on an insulating surface;

crystallizing the first semiconductor film by a heat treatment in a furnace;

patterning the crystallized first semiconductor film to form a first semiconductor island;

forming a second semiconductor film comprising amorphous silicon film on the first semiconductor island, said second semiconductor film extending beyond side edges of the first semiconductor island so that an upper and side surfaces of the first semiconductor island are covered by the second semiconductor film;

irradiating the second semiconductor film with an infrared light for crystallizing the second semiconductor film; and forming a semiconductor island comprising the first semiconductor film and the second semiconductor film.

29. The method according to claim 28, wherein the second amorphous semiconductor film is crystallized with the surface of the first semiconductor film used as a crystal nuclei.

30. The method according to claim 28, wherein said semiconductor device is at least one of the group consisting of a liquid crystal display device, an EL display device, an EC display device, an image sensor, and a CCD.

31. The method according to claim 28, wherein said semiconductor device is at least one of the group consisting of a video camera, an electronic still camera, a projector, a head mount display, a car navigation system, a personal computer, and a portable information terminal.

* * * * *